United States Patent
Kwak

(10) Patent No.: US 9,401,214 B2
(45) Date of Patent: Jul. 26, 2016

(54) THREE-DIMENSIONAL MEMORY DEVICE AND OPERATING METHOD OF A STORAGE DEVICE INCLUDING THE SAME

(71) Applicant: SAMSUNG ELECTRONICS CO., LTD., Suwon-Si, Gyeonggi-Do (KR)

(72) Inventor: DongHun Kwak, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/592,459

(22) Filed: Jan. 8, 2015

(65) Prior Publication Data
US 2015/0332773 A1 Nov. 19, 2015

(30) Foreign Application Priority Data

May 13, 2014 (KR) .................. 10-2014-0057308

(51) Int. Cl.
| | |
|---|---|
| *G11C 16/04* | (2006.01) |
| *G11C 16/14* | (2006.01) |
| *G11C 16/08* | (2006.01) |
| *G11C 16/34* | (2006.01) |
| *G11C 7/14* | (2006.01) |
| *G11C 7/22* | (2006.01) |
| *G11C 16/16* | (2006.01) |
| *G11C 16/26* | (2006.01) |
| *H01L 27/115* | (2006.01) |
| *G11C 16/10* | (2006.01) |

(52) U.S. Cl.
CPC *G11C 16/14* (2013.01); *G11C 7/14* (2013.01); *G11C 7/227* (2013.01); *G11C 16/0483* (2013.01); *G11C 16/08* (2013.01); *G11C 16/16* (2013.01); *G11C 16/26* (2013.01); *G11C 16/349* (2013.01); *G11C 16/3427* (2013.01); *G11C 16/3445* (2013.01); *H01L 27/115* (2013.01); *G11C 16/10* (2013.01)

(58) Field of Classification Search
CPC .... G11C 16/0483; G11C 16/10; G11C 16/08; G11C 2213/71; G11C 11/5642; G11C 16/28; G11C 11/5628; G11C 7/22; G11C 7/14
USPC ............ 365/185.11, 185.17–185.18, 185.03, 365/210.1
See application file for complete search history.

(56) References Cited

U.S. PATENT DOCUMENTS

| | | | |
|---|---|---|---|
| 8,174,890 B2 | 5/2012 | Maeda et al. | |
| 8,194,467 B2 | 6/2012 | Mikajiri et al. | |
| 8,199,573 B2 | 6/2012 | Fukuzumi et al. | |
| 8,228,733 B2 | 7/2012 | Tokiwa et al. | |

(Continued)

*Primary Examiner* — David Lam
(74) *Attorney, Agent, or Firm* — F. Chau & Associates, LLC

(57) ABSTRACT

A storage device is provided. The storage device includes a memory controller and at least one nonvolatile memory device including memory blocks having a pipe-shaped bit cost scalable (PBiCS) structure. Each of the memory blocks penetrates word lines stacked on a substrate in the form of plates and includes a first pillar, a second pillar, and a back-gate. The second pillar includes a semiconductor layer, an insulating layer, and a charge storage layer. The back-gate includes a pillar connection portion to connect the first and second pillars to each other and is disposed between the substrate and the word lines. The memory controller includes an adjacent cell management unit configured to control the at least one nonvolatile memory device such that a program operation, an erase operation or a read operation is performed on memory cells adjacent to the back-gate, unlike the other memory cells.

14 Claims, 27 Drawing Sheets

(56) References Cited

U.S. PATENT DOCUMENTS

| | | |
|---|---|---|
| 8,310,875 B2 | 11/2012 | Sakurai et al. |
| 8,358,539 B2 | 1/2013 | Maeda |
| 8,379,456 B2 | 2/2013 | Park et al. |
| 8,422,299 B2 | 4/2013 | Iguchi et al. |
| 8,537,610 B2 | 9/2013 | Okhonin et al. |
| 8,570,802 B2 | 10/2013 | Shirakawa |
| 8,934,302 B2 * | 1/2015 | Kwak ..................... G11C 7/00 365/185.05 |
| 2013/0009235 A1 | 1/2013 | Yoo |
| 2013/0107628 A1 | 5/2013 | Dong et al. |
| 2013/0322174 A1 | 12/2013 | Li et al. |
| 2014/0098612 A1 | 4/2014 | Hosono et al. |

\* cited by examiner

|  | Vpre | Vdvlp | Tpre | Tdvlp | Tsns |
|---|---|---|---|---|---|
| Normal Cell | Vpre_NC | Vdvlp_NC | Tpre_NC | Tdvlp_NC | Tsns_NC |
| Adjacent Cell | Vpre_AC | Vdvlp_AC | Tpre_AC | Tdvlp_AC | Tsns_AC |

THREE-DIMENSIONAL MEMORY DEVICE AND OPERATING METHOD OF A STORAGE DEVICE INCLUDING THE SAME

CROSS-REFERENCE TO RELATED APPLICATION

This U.S. non-provisional patent application claims priority under 35 U.S.C. §119 to Korean Patent Application No. 10-2014-0057308, filed on May 13, 2014, in the Korean Intellectual Property Office, the disclosure of which is incorporated by reference herein in its entirety.

TECHNICAL FIELD

The present inventive concept relates to a three-dimensional (3D) memory device, and more particularly, to an operating method of a storage device including the 3D memory device.

DISCUSSION OF THE RELATED ART

Semiconductor memory devices are classified into volatile semiconductor memory devices and nonvolatile semiconductor memory devices. Nonvolatile semiconductor memory devices can retain their stored data even when power supplied to the nonvolatile semiconductor devices is interrupted. Data stored in the nonvolatile semiconductor memory may be permanent or reprogrammable depending on a memory manufacturing technology. The nonvolatile semiconductor memory device is used for storing programs and micro codes in a wide range of applications such as computers, avionics, communication, consumer electronic technologies, or the like.

SUMMARY OF THE INVENTION

According to an exemplary embodiment of the present inventive concept, a three-dimensional (3D) memory device is provided. The 3D memory device includes memory blocks, an address decoder, a voltage generation circuit, an input/output circuit, and a control logic. Each of the memory blocks includes a plurality of strings including a selection select transistor, first memory cells, a back-gate transistor, second memory cells, and a ground select transistor coupled in series between a bit line and a common source line. Each of the first and second memory cells includes a pillar-shaped semiconductor layer stacked in a direction perpendicular to a substrate, an insulating layer surrounding the semiconductor layer, a charge storage layer surrounding the insulating layer, and an insulating layer surrounding the charge storage layer. The address decoder is configured to select one of the memory blocks in response to an address by driving a string select line connected to the string select transistor, word lines connected to the first and second memory cells, a back-gate line connected to the back-gate transistor, and a ground select line connected to the ground select transistor. The voltage generation circuit is configured to generate voltage applied to the bit line, the common source line, the string select line, the word lines, the back-gate line, and the ground select line; an input/output circuit configured to program/erase data into/from the selected memory block or read data from the selected memory block. The control logic is configured to control the address decoder, the voltage generation circuit, and the input/output circuit such that an adjacent cell operation on at least one memory cell adjacent to the back-gate transistor among the first and second memory cells of the selected memory block is made different from a normal cell operation on the other memory cells.

According to an exemplary embodiment of the present inventive concept, a storage device is provided. The storage device includes at least one nonvolatile memory device and a memory controller. The at least one nonvolatile memory device includes memory blocks of pipe-shaped bit cost scalable (PBiCS) structure. Each of the memory blocks penetrates word lines stacked on a substrate in the form of plates. Each of the memory blocks includes a first pillar, a second pillar, and a back-gate. The second pillar includes a semiconductor layer, an insulating layer, and a charge storage layer. The back-gate includes a pillar connection portion to connect the first and second pillars to each other. The back-gate is disposed between the substrate and the word lines. The memory controller includes an adjacent cell management unit configured to control the least one nonvolatile memory device such that a program operation, an erase operation or a read operation is performed on memory cells adjacent to the back-gate, unlike the other memory cells.

According to an exemplary embodiment of the present inventive concept, an operating method of a storage device is provided. The storage device includes a memory controller for controlling at least one nonvolatile memory device and the at least one nonvolatile memory device. The at least one nonvolatile memory device includes memory blocks having a pipe-shaped bit cost scalable (PBiCS) structure. Each of the memory blocks penetrates word lines stacked on a substrate in the form of plates and includes a first pillar, a second pillar, and a back-gate. The second pillar includes a semiconductor layer, an insulating layer, and a charge storage layer. The back-gate includes a pillar connection portion connecting the first and second pillars to each other and is disposed between the substrate and the word lines. The operating method includes determining whether a memory cell to operate is an adjacent cell adjacent to the back-gate based on an address, performing an adjacent cell operation when the memory cell to operate is the adjacent cell, and performing a normal cell operation when the memory cell to operate is not the adjacent cell. The adjacent cell operation is performed by at least one core operation condition or at least one core operation policy which is different from that of the normal cell operation.

BRIEF DESCRIPTION OF THE DRAWINGS

The accompanying drawings are included to provide a further understanding of the present inventive concept. In the drawings.

DETAILED DESCRIPTION OF THE EMBODIMENTS

Figure 1:
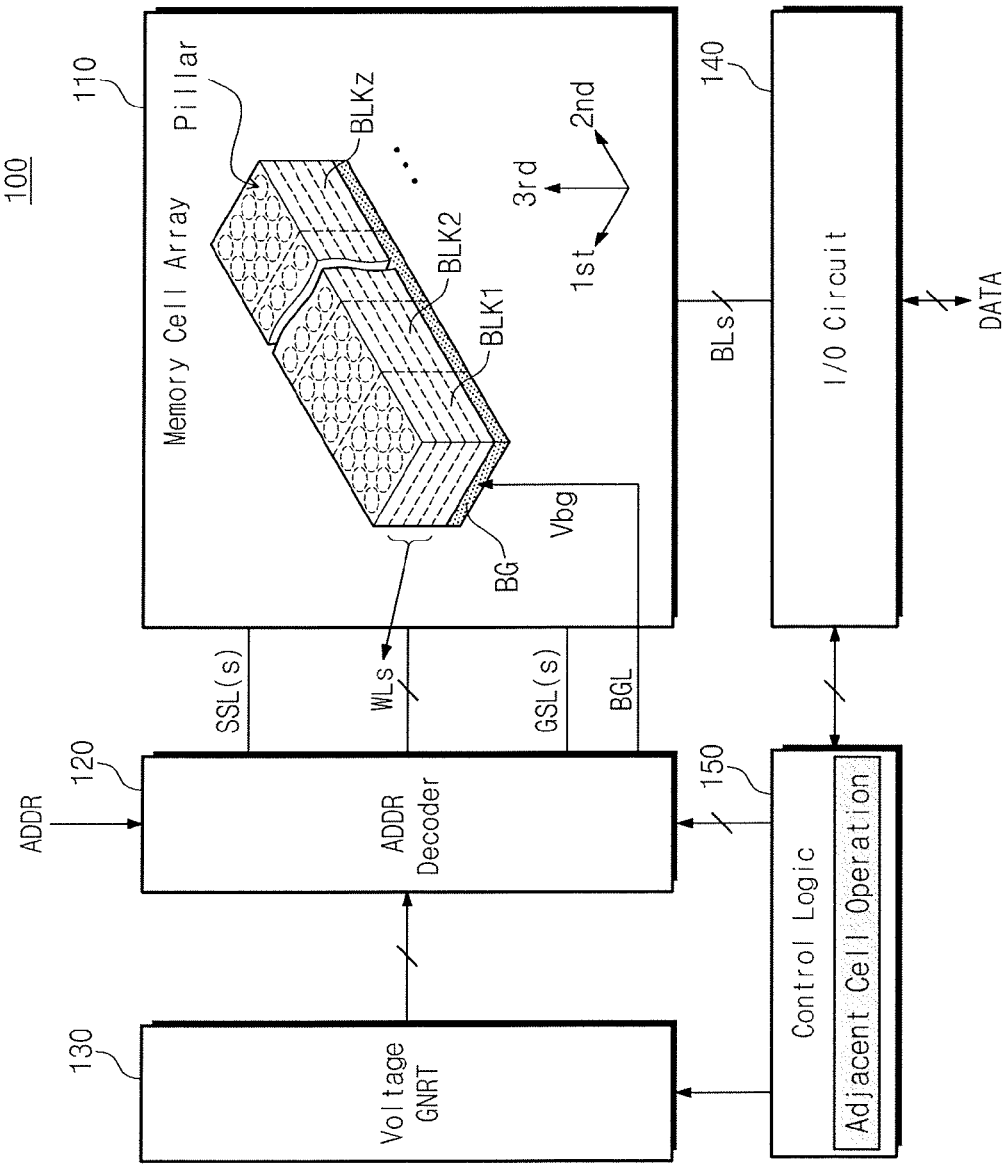
FIG. 1 illustrates a three-dimensional (3D) memory device according to an exemplary embodiment of the present inventive concept.

Exemplary embodiments of the present inventive concept will now be described more fully hereinafter with reference to the accompanying drawings.

The present inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a 3D device 100 according to an exemplary embodiment of the present inventive concept. As illustrated, the 3D memory device 100 includes a memory cell array 110, an address decoder (ADDR Decoder) 120, a voltage generation circuit (Voltage GNRT) 130, an input/output circuit (I/O Circuit) 140, and a control logic 150.

The memory cell array 110 includes a plurality of memory blocks BLK1 to BLKz (z being an integer equal to or greater than 2). Each of the memory blocks BLK1 to BLKz is connected to the address decoder 120 through a back-gate line BGL, word lines WLs, at least one string select line SSL, and at least one ground select line GSL. Each of the memory blocks BLK1 to BLKz is connected to the I/O circuit 130 through bit lines BLs. In an exemplary embodiment, the word lines WLs may be implemented in the form of stacked plates.

Each of the memory blocks BLK1 to BLKz includes a plurality of strings. Each of the strings includes at least two pillars formed through the word lines in the form plates. The at least two pillars may be connected to each other by a pillar connection portion included in a back-gate (not shown) formed on a substrate. Each of the pillars may be disposed on a substrate in a first direction and a second direction. The second direction is different from the first direction. Each of the pillars may be disposed on the substrate in a third direction. The third direction is perpendicular to a plane formed in the first direction and the second direction. Each of the pillars may include a semiconductor layer having a cylinder form extending in a direction perpendicular to the substrate, an insulating layer surrounding the semiconductor layer, and a charge storage layer surrounding the insulating layer.

For brevity of description, let it be assumed that each of the strings includes two pillars. Each of the strings includes at least one string select transistor coupled in series between a bit line and a common source line, first memory cells (or first cell transistors), a back-gate transistor, second memory cells (or second cell transistors), and at least one ground select transistor. Each of the first and second memory cells may be implemented with a stacked-gate type transistor including an insulating layer, a charge storage layer, an insulating layer, a control gate, and the like. In addition, each of the first and second memory cells may store at least one bit. At least one dummy cell may be included between the at least one string select transistor and the first memory cells. In an exemplary embodiment, at least one dummy cell may be included between the second memory cells and the at least one ground select transistor. The back-gate transistor includes a pipe-shaped pillar connection portion to connect a first pillar corresponding to the first memory cells and a second pillar corresponding to the second memory cells to each other. The pillar connection portion may be buried in the back-gate. The pillar connection portion and the back-gate constitute a back-gate transistor. A conductive state and a non-conductive state of the pillar connection portion may be decided based on a back-gate voltage Vbg applied to the back-gate.

The address decoder 120 may select one of the memory blocks BLK1 to BLKz in response to an address. The address decoder 120 is connected to the memory cell array 110 through the back-gate line BGL, the word lines WLs, the at least one string selection line SSL, and the at least one ground select line GSL.

In an exemplary embodiment, the address decoder 120 may include a back-gate line driver to operate the back-gate line BGL, at least one word line driver to operate the word lines WLs, a string select line driver to operate the string select line SSL, and a ground select line driver to operate the ground select line GSL.

The address decoder 120 may decode a column address among an input address. The decoded column address may be transmitted to the I/O circuit 140. In an exemplary embodiment, the address decoder 120 may include a row decoder, a column decoder, an address buffer, and the like.

The voltage generation circuit 130 may generate voltages required for operations (e.g., a program voltage, a pass voltage, a read voltage, a read pass voltage, a verify voltage, an erase voltage, a common source line voltage, a well voltage, etc.). The voltage generation circuit 130 may generate a word line voltage and a back-gate voltage Vbg required for program/read/erase operations. The back-gate voltage Vbg may be input to a back-gate transistor of a string.

The I/O circuit 140 is connected to the memory cell array 110 through bit lines BLs. The I/O circuit 140 may be configured to receive a decoded column address from the address decoder 120. The I/O circuit 140 may select bit lines BLs using the decoded column address.

The I/O circuit 140 includes a plurality of page buffers to store data to be programmed during a program operation or to store read data during a read operation. Each of the page buffers may include a plurality of latches. During a program operation, the data stored in the page buffers may be programmed into a page corresponding to a selected memory block through bit lines BLs. During a read operation, the data read from the page corresponding to the selected memory block may be stored in the page buffers through the bit lines BLs. The I/O circuit 140 may read data from a first region of the memory cell array 110 and store the read data in a second region of the memory cell array 110. For example, the I/O circuit 140 may be implemented to perform a copy-back operation.

The control logic 150 may control the overall operation (program/read/erase operations, etc.) of the 3D memory device 100. The control logic 150 may operate in response to externally input control signals or commands. For example, the control logic 150 may support an adjacent cell operation. The adjacent cell operation means an operation of a cell adjacent to a specific position and an operation preparing for the other normal cells. The specific position may be one of string/ground transistors and a back-gate transistor.

The 3D memory device 100 according to an exemplary embodiment of the present inventive concept may support an adjacent cell operation for a memory cell adjacent to a specific position to ensure optimal performance, as compared to a conventional 3D memory device.

Figure 2:
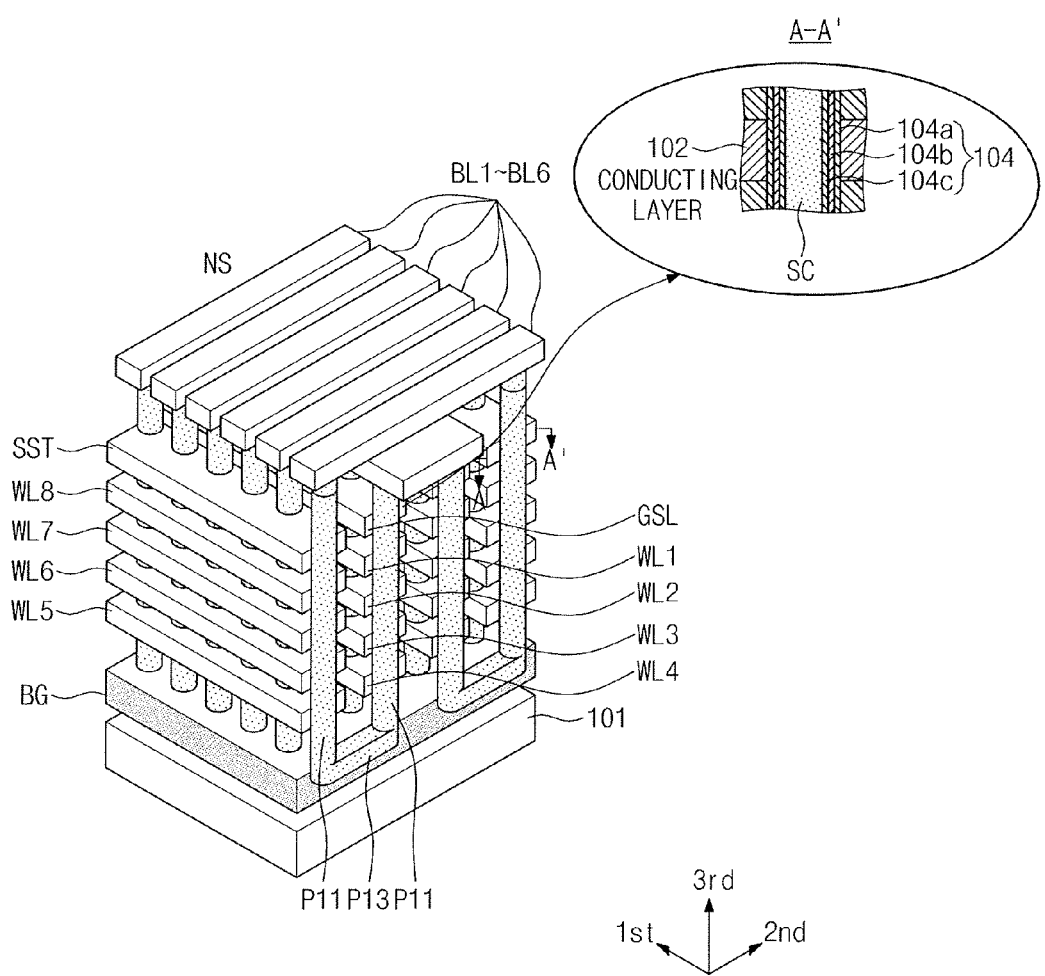
FIG. 2 illustrates a memory block shown in FIG. 1 according to an exemplary embodiment of the present inventive concept.

FIG. 2 illustrates a memory block shown in FIG. 1 according to an exemplary embodiment of the present inventive concept. For brevity of description, let it be assumed that the number of layers of word lines is four. Referring to FIG. 2, a memory block is implemented using a pipe-shaped bit cost scalable (PBiCS) structure where lower ends of adjacent memory cells connected in series are connected by a pipe. A memory block BLK includes strings NS of m×n (m and n being positive integers). In FIG. 2, m=6 and n=2. Each of the strings NS includes serially connected memory cells MC1 to MC8. First upper ends of the memory cells MC1 to MC8 are connected to a string select line SSL, and second upper ends of the memory cells MC1 to MC8 are connected to a ground select transistor GST. Lower ends of the memory cells MC1 to MC8 are pipe-connected.

Memory cells constituting a string NS are stacked on a plurality of semiconductor layers to be formed. Each string NS includes a first pillar P11, a second pillar P12, and a pillar connection portion P13 connecting the first and second pillars P11 and P12 to each other. The first pillar P11 is connected to a bit line (e.g., BL1) and the pillar connection portion P13 and is formed through the ground select line GSL and word lines WL1 to WL4. As shown in FIG. 2, the string NS is implemented in the form of a U-shaped pillar.

In an exemplary embodiment, a back-gate BG may be formed on a substrate 101 and the pillar connection portion P13 may be implemented in the back-gate BC. In an exemplary embodiment, a back-gate BG may commonly exist in blocks BLK. The back-gate may be isolated from a back-gate of another block.

A sectional structure of a memory cell corresponding to a section A-A' in FIG. 2 may include a gate oxide layer 104c, a charge storage layer 104b, and an insulating layer (e.g., a blocking layer) 104a having a higher dielectric constant than the gate oxide layer 104 around a semiconductor layer SC sequentially along an in-plane of a first direction and a second direction from a surface of the semiconductor layer SC. A conductive layer 102 is formed to surround a surface of the blocking layer 104a. The conductive layer 102 is also called a word line WL as a control gate of a memory cell MC.

Figure 3:
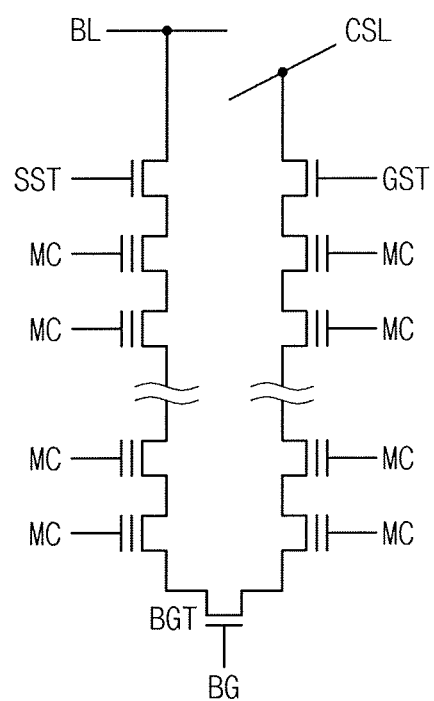
FIG. 3 is a circuit diagram of a single string shown in FIG. 2 according to an exemplary embodiment of the present inventive concept.

FIG. 3 is a circuit diagram of a single string shown in FIG. 2 according to an exemplary embodiment of the present inventive concept. Referring to FIG. 3, a string NS includes a string select transistor SST, a plurality of first memory cells MCs, a back-gate transistor BGT, a plurality of second memory cells MCs, and a ground select line GST that are connected in series between a bit line BL and a common source line CSL. The back-gate transistor BGT includes a gate connected to a back-gate BG.

Figure 4:
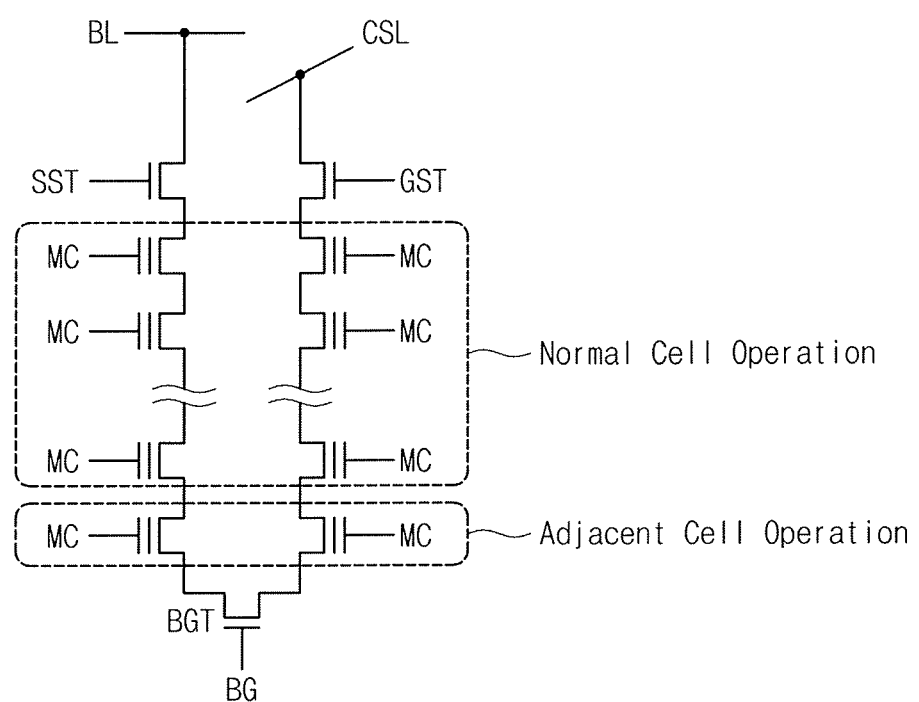
FIG. 4 illustrates an adjacent cell operation of a 3D memory device 100 according to an exemplary embodiment of the present inventive concept.

FIG. 4 illustrates an adjacent cell operation of a 3D memory device 100 according to an exemplary embodiment of the present inventive concept. Referring to FIG. 4, memory cells of a string include an adjacent cell adjacent to a back-gate transistor BGT and a normal cell apart from the adjacent cell.

The 3D memory device 100 may perform an adjacent cell operation, which is different from a normal cell operation, on a memory cell most adjacent to the back-gate transistor BGT during program/read/erase operations. Thus, the 3D memory device 100 may vary a core operation condition or an application policy (e.g., a program parameter offset, a read offset, etc.) to improve characteristics of an adjacent cell. Hereinafter, the adjacent cell operation according to an exemplary embodiment of the present inventive concept will be described in detail.

Figure 5:
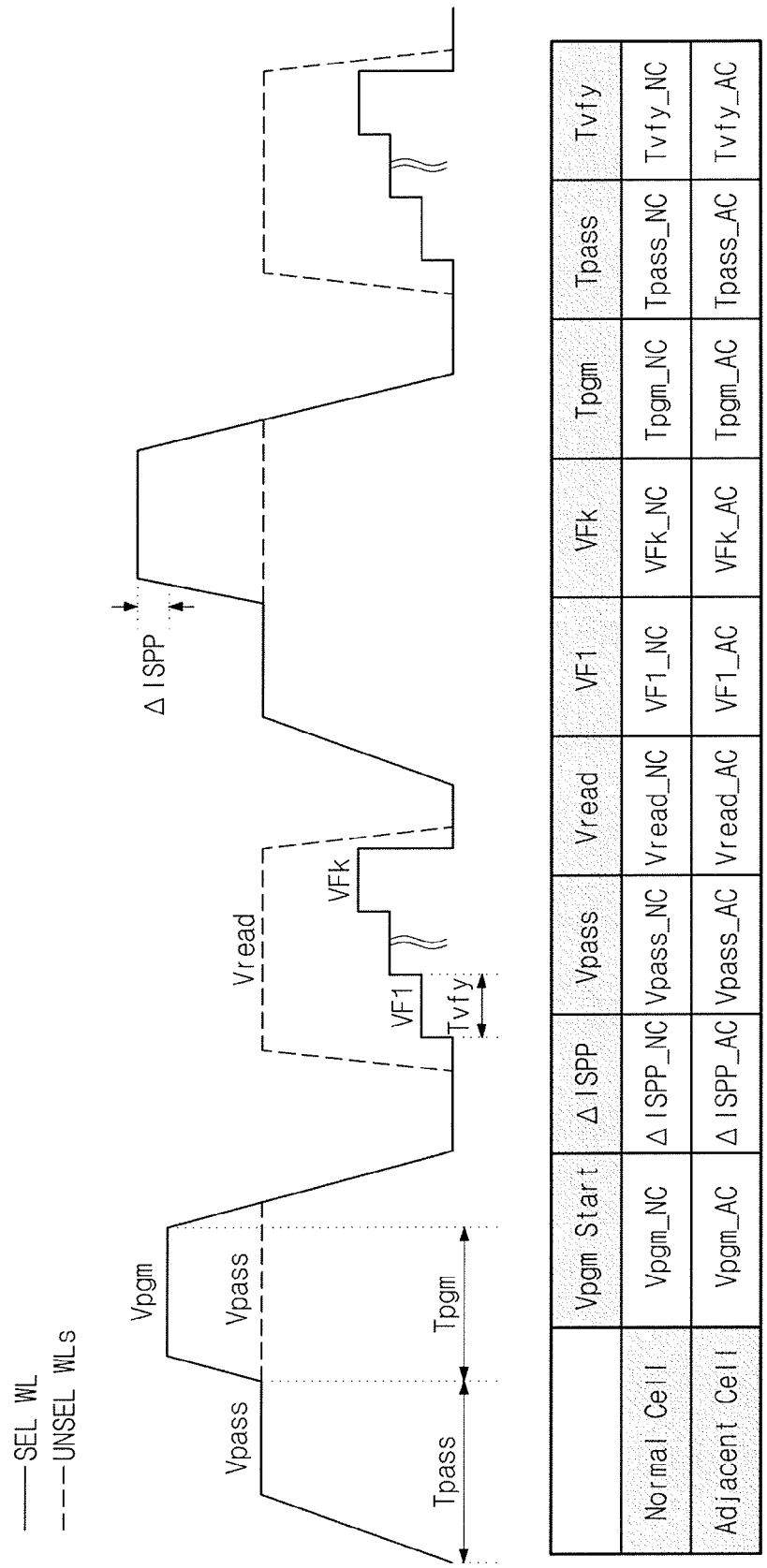
FIG. 5 illustrates a program operation of a 3D memory device according to an exemplary embodiment of the present inventive concept.

FIG. 5 illustrates a program operation of a 3D memory device 100 according to an exemplary embodiment of the present inventive concept. Referring to FIG. 5, there are shown a voltage pulse applied to a selected word line SEL WL and a voltage pulse applied to unselected word lines UNSEL WLs during a program operation.

The voltage pulse applied during a program operation may includes a program pulse and a verify pulse. Application of the program pulse is performed as follows. After a pass voltage Vpass is applied to the selected word line SEL WL and the unselected word lines UNSEL WLs for a pass voltage applying time Tpass, a program voltage Vpgm is applied to the selected word line SEL WL for a program voltage applying time Tpgm. In this case, the pass voltage is maintained to the unselected word lines UNSEL WLs. Thus, the selected word line SEL WL and the unselected word lines UNSEL WLs are recovered.

In addition, application of the verify pulse is performed as follows. A read pass voltage Vread is applied to the unselected word lines UNSEL WLs and verify pulses VF1, . . . , and VFk (k being a positive integer) are applied to the selected word line SEL WL for a verify voltage applying time Tvfy. Thus, the selected word line SEL WL and unselected word lines UNSEL WLs are recovered.

After a program voltage Vpass increases by a predetermined voltage ΔISPP, the above-mentioned operations of applying the program pulse and the verify pulse are repeated.

As shown in FIG. 5, the normal cell program operation may be performed by program parameters such as a program start voltage Vpgm_NC, a predetermined voltage ΔISPP_NC, a pass voltage Vpass_NC, a read pass voltage Vread_NC, a verify voltage VF1_NC, a verify voltage VFk_NC, a program voltage applying time Tpgm_NC, a pass voltage applying time Tpass_NC, and a verify voltage applying time Tvfy_NC.

As shown in FIG. 5, the adjacent cell program operation may be performed by program parameters such as a program start voltage Vpgm_AC, a predetermined voltage ΔISPP_AC, a pass voltage Vpass_AC, a read pass voltage Vread_AC, a verify voltage VF1_AC, a verify voltage VFk_AC, a program voltage applying time Tpgm_AC, a pass voltage applying time Tpass_AC, and a verify voltage applying time Tvfy_AC.

According to an exemplary embodiment of the present inventive concept, at least one of the program parameters (e.g., the program start voltage Vpgm_AC, the predetermined voltage ΔISPP_AC, the pass voltage Vpass_AC, the read pass voltage Vread_AC, the verify voltage VF1_AC, the verify voltage VFk_AC, the program voltage applying time Tpgm_AC, the pass voltage applying time Tpass_AC, and the verify voltage applying time Tvfy_AC of the adjacent cell program operation) of the adjacent cell program operation may be different from that of the normal program operation.

During the program operation shown in FIG. 5, the program voltage Vpgm is applied after the pass voltage Vpass is applied. However, the present inventive concept is not limited thereto. The 3D memory device 100 according to an exemplary embodiment of the present inventive concept may apply an offset voltage higher than the pass voltage Vpass for a predetermined time to easily apply the pass voltage.

Figure 6:
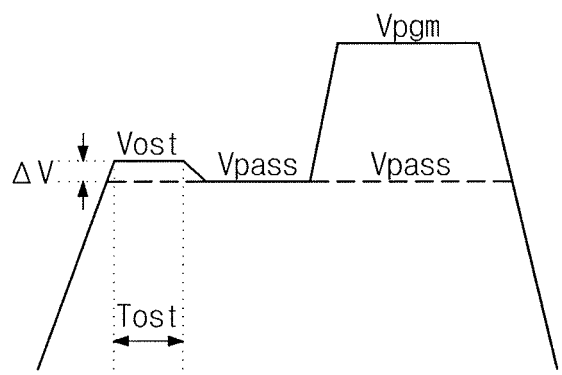
FIG. 6 illustrates a program operation of a 3D memory device according to an exemplary embodiment of the present inventive concept.

FIG. 6 illustrates a program operation of a 3D memory device according to an exemplary embodiment of the present inventive concept. Referring to FIG. 6, during a read operation, an offset voltage Vost is applied for a predetermined time Tost before a pass voltage Vpass is applied.

As shown in FIG. 6, a normal cell program operation may be performed by offset parameters such as an offset voltage Vost_NC and an offset time Tost_NC.

As shown in FIG. 6, an adjacent cell program operation may be performed by offset parameters such as an offset voltage Vost_AC and an offset time Tost_AC.

According to an exemplary embodiment of the present inventive concept, at least one of the offset parameters (e.g., the offset voltage Vost_AC and the offset time Tost_AC) of the adjacent cell program operation may be different that of the normal cell program operation.

During the program operation shown in FIG. 6, an offset voltage Vost higher than the pass voltage Vpass is applied for a predetermined time. However, the present inventive concept is not limited thereto. The 3D memory device 100 according to an exemplary embodiment of the present inventive concept may apply a voltage lower than the pass voltage Vpass for a predetermined time.

Figure 7:
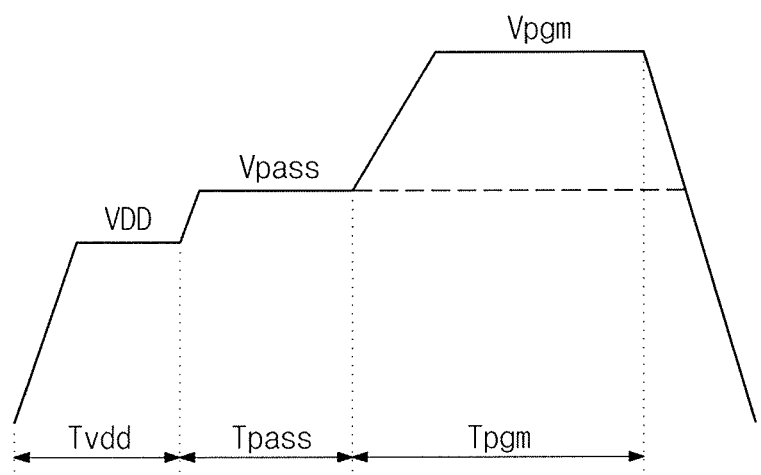
FIG. 7 illustrates a program operation of a 3D memory device according to an exemplary embodiment of the present inventive concept.

FIG. 7 illustrates a program operation of a 3D memory device according to an exemplary embodiment of the present inventive concept. Referring to FIG. 7, during the program operation, a supply voltage VDD is applied for a predetermined time Tvdd before a pass voltage Vpass is applied. The supply voltage VDD is lower than the pass voltage Vpass.

As shown in FIG. 7, a normal cell program operation may be performed by applying time parameters such as a supply voltage applying time Tvdd_NC, a pass voltage applying time Tpass_NC, and a program voltage applying time Tpgm_NC.

As shown in FIG. 7, an adjacent cell program operation may be performed by applying time parameters such as a supply voltage applying time Tvdd_AC, a pass voltage applying time Tpass_AC, and a program voltage applying time Tpgm_AC.

According to an exemplary embodiment of the present inventive concept, at least one of the parameters (e.g., the supply voltage applying time Tvdd_AC, the pass voltage applying time Tpass_AC, and the program voltage applying time Tpgm_AC) of the adjacent cell program operation may be different from that of the normal cell program operation.

Figure 8:
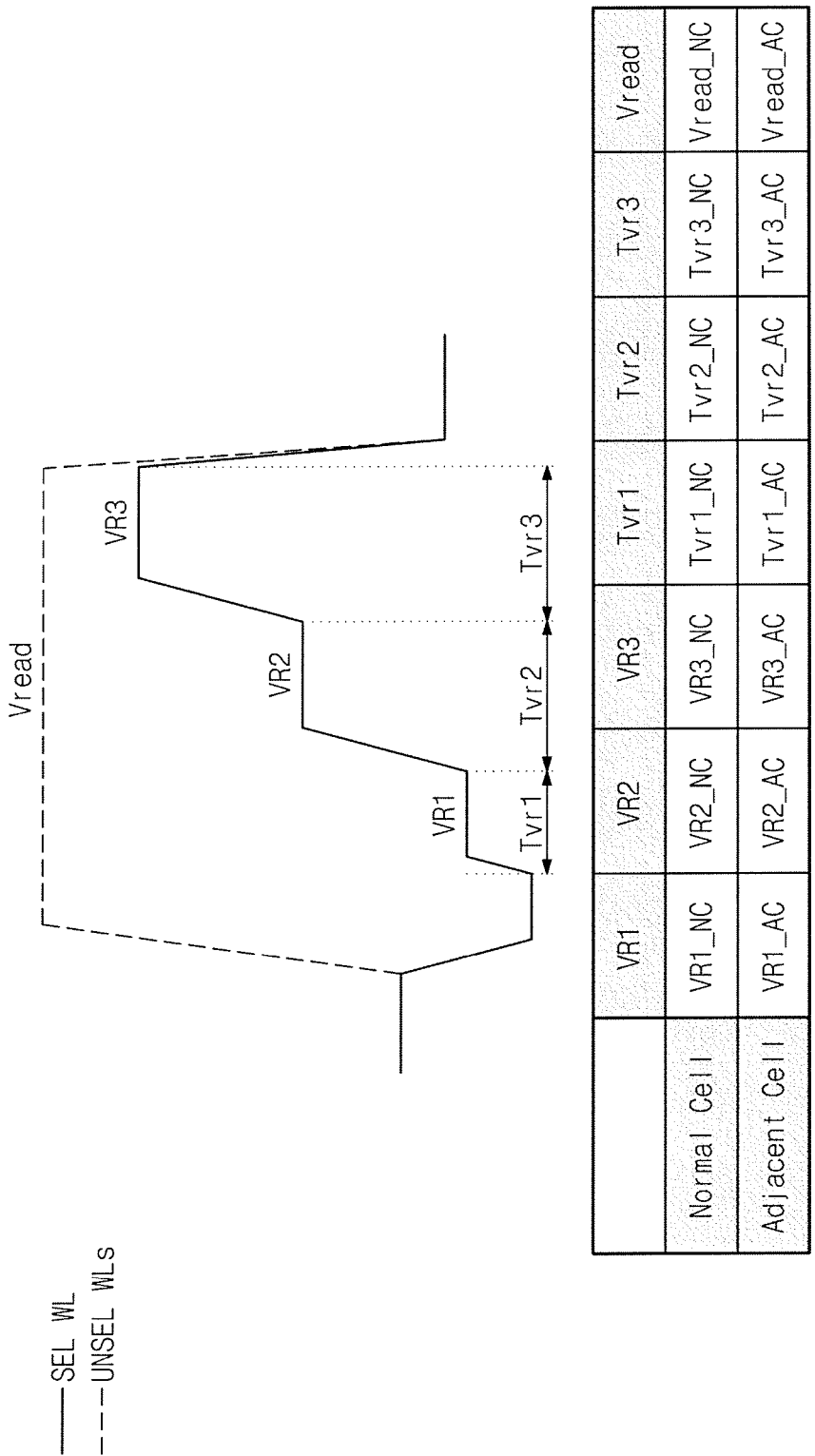
FIG. 8 illustrates a read operation of a 3D memory device according to an exemplary embodiment of the present inventive concept.

FIG. 8 illustrates a read operation of a 3D memory device according to an exemplary embodiment of the present inventive concept. Referring to FIG. 8, during a read operation, a first read voltage VR1 is applied for a first read time Tvr1. In addition, a second read voltage VR2 is applied for a second read time Tvr2. In addition, a third read voltage VR3 is applied for a third read voltage Tvr3. For brevity of description, three read voltage VR1 to VR3 are shown in FIG. 8. However, the number of read voltage according to an exemplary embodiment of the present inventive concept is not limited to three.

A normal cell read operation may be performed by read parameters such as read voltages VR1_NC to NR3_NC, read times Tvr1_NC to Tvr3_NC, and a read pass voltage Vread_NC.

An adjacent cell read operation may be performed by read parameters such as read voltages VR1_AC to NR3_AC, read times Tvr1_AC to Tvr3_AC, and a read pass voltage Vread_AC.

According to an exemplary embodiment of the present inventive concept, at least one of the read parameters (e.g., VR1_AC to NR3_AC, read times Tvr1_AC to Tvr3_AC, and a read pass voltage Vread_AC) of the adjacent cell read operation may be different from that of the normal cell read operation.

Figure 9:
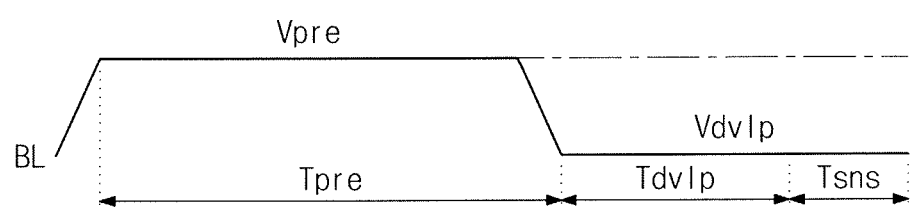
FIG. 9 illustrates a read operation of a 3D memory device according to an exemplary embodiment of the present inventive concept.

FIG. 9 illustrates a read operation of a 3D memory device according to an exemplary embodiment of the present inventive concept. Referring to FIG. 9, a sense operation on a bit line BL is divided into a precharge period Tpre in which a precharge voltage Vpre is applied to a bit line BL, a develop period Tdvlp in which the precharge voltage is maintained or decreases to a develop voltage Vdvlp according to a state of a memory cell connected to the bit line BL, and a sense period Tsns in which a voltage state of the bit line BL is sensed.

As shown in FIG. 9, a normal cell sense operation may be performed by sensing parameters such as a precharge voltage Vpre_NC, a develop voltage Vdvlp_NC, a precharge time Tpre_NC, a develop time Tdvlp_NC, and a sense time Tsns_NC.

As shown in FIG. 9, an adjacent cell sense operation may be performed by sensing parameters such as a precharge voltage Vpre_AC, a develop voltage Vdvlp_AC, a precharge time Tpre_AC, a develop time Tdvlp_AC, and a sense time Tsns_AC.

According to an exemplary embodiment of the present inventive concept, at least one of the sensing parameters (e.g., the precharge voltage Vpre_AC, the develop voltage Vdvlp_AC, the precharge time Tpre_AC, the develop time Tdvlp_AC, and the sense time Tsns_AC) of the adjacent cell sense operation may be different from that of the normal cell sense operation.

Figure 10:
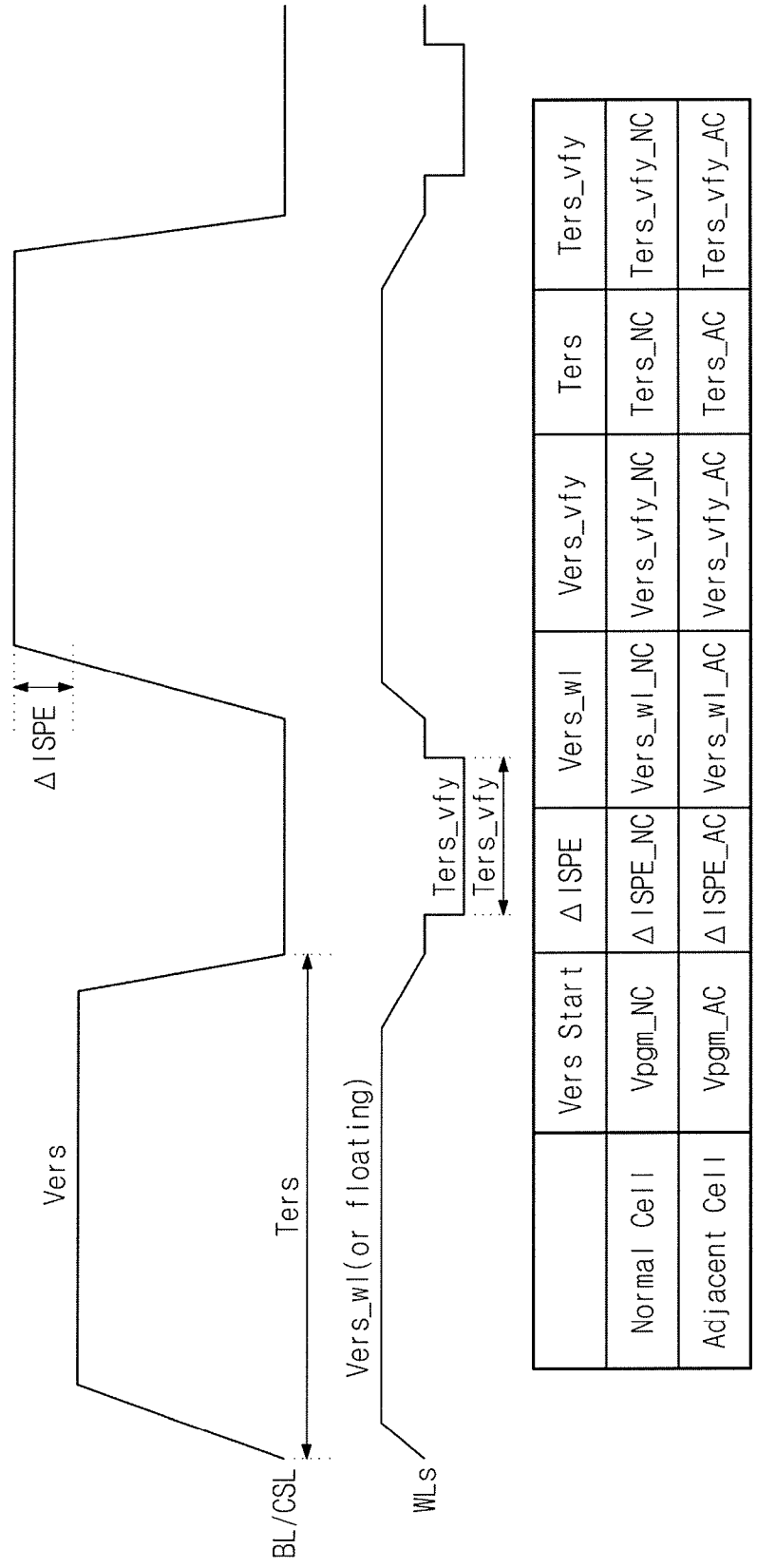
FIG. 10 illustrates an erase operation of a 3D memory device according to an exemplary embodiment of the present inventive concept.

FIG. 10 illustrates an erase operation of a 3D memory device according to an exemplary embodiment of the present inventive concept. Referring to FIG. 10, during the erase operation, an erase voltage Vers is applied to bit line/common source line BL/CSL for an erase voltage applying time Ters. Then an erase verify voltage Vers_vfy is applied to word lines WLs for an erase verify voltage applying time Ters_vfy. In an exemplary embodiment, a word line erase voltage Vers_may be applied to the word lines WLs when the erase voltage Vers is applied to the bit line/common source line BL/CSL. In an exemplary embodiment, the word lines WLs may be floated when the erase voltage Vers is applied to the bit line/common source line BL/CSL. Thus, the erase operation continues to be performed using the erase voltage Vers increased by a predetermined voltage ΔISPE.

As shown in FIG. 10, a normal cell erase operation may be performed by erase parameters such as an erase start voltage Vers_NC, a predetermined voltage ΔISPE_NC, a word line erase voltage Vers_wl_NC, an erase verify voltage Very_vfy_NC, an erase voltage applying time Ters_NC, and an erase verify voltage applying time Ters_vfy_NC.

As shown in FIG. 10, an adjacent cell erase operation may be performed by erase parameters such as an erase start voltage Vers_AC, a predetermined voltage ΔISPE_AC, a word line erase voltage Vers_wl_AC, an erase verify voltage Very_vfy_AC, an erase voltage applying time Ters_AC, and an erase verify voltage applying time Ters_vfy_AC.

According to an exemplary embodiment of the present inventive concept, at least one of the erase parameters (e.g., the erase start voltage Vers_AC, the predetermined voltage ΔISPE_AC, the word line erase voltage Vers_wl_AC, the erase verify voltage Very_vfy_AC, the erase voltage applying time Ters_AC, and the erase verify voltage applying time Ters_vfy_AC) of the adjacent cell erase operation may be different from that of the normal cell erase operation.

During the erase operation shown in FIG. 10, the erase voltage Vers is applied for a predetermined time Ters. However, the present inventive concept is not limited thereto. The 3D memory device 100 according to an exemplary embodiment of the present inventive concept may apply an erase offset voltage higher than a pass voltage Vpass for a predetermined time to easily apply the erase voltage Vers.

Figure 11:
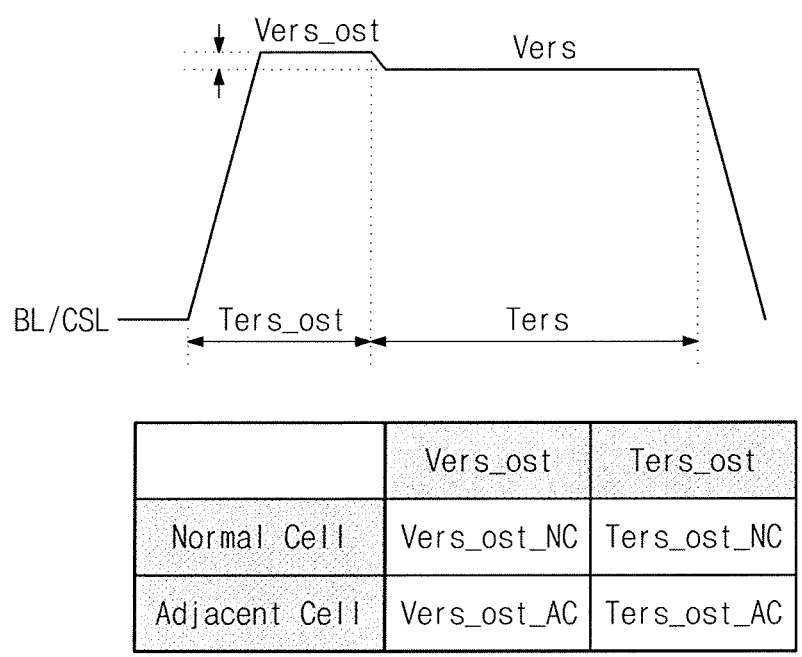
FIG. 11 illustrates an erase operation of a 3D memory device according to an exemplary embodiment of the present inventive concept.

FIG. 11 illustrates an erase operation of a 3D memory device according to an exemplary embodiment of the present inventive concept. Referring to FIG. 11, during the erase operation, an erase offset voltage Vers_ost is applied for a predetermined time Ters_ost before an erase voltage Vers is applied.

As shown in FIG. 11, a normal cell erase operation may be performed by erase offset parameters such as an erase offset voltage Vers_ost_NC and an erase offset time Ters_ost_NC.

As shown in FIG. 11, an adjacent cell erase operation may be performed by erase offset parameters such as an erase offset voltage Vers_ost_AC and an erase offset time Ters_ost_AC.

According to an exemplary embodiment of the present inventive concept, at least one of the erase offset parameters (e.g., the erase offset voltage Vers_ost_AC and the erase offset time Ters_ost_AC) of the adjacent cell erase operation may be different from that of the normal cell erase operation.

During the erase operation shown in FIG. 11, an erase offset voltage Vers_ost higher than the erase voltage Vers is applied for a predetermined time. However, the present inventive concept is not limited thereto. The 3D memory device 100 according to the inventive concept may apply a voltage lower than the erase voltage Vers_ost for a predetermined time.

Figure 12:
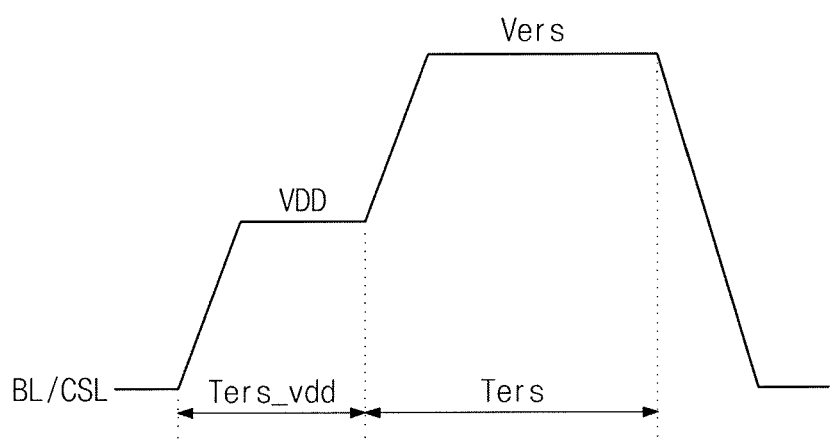
FIG. 12 illustrates an erase operation of a 3D memory device according to an exemplary embodiment of the present inventive concept.

FIG. 12 illustrates an erase operation of a 3D memory device according to an exemplary embodiment of the present inventive concept. Referring to FIG. 12, during the erase operation, a supply voltage VDD is applied for a predetermined time Ters_vdd before an erase voltage Vers is applied. The supply voltage VDD is lower than the erase voltage Vers.

As shown in FIG. 12, a normal cell erase operation may be performed by applying time parameters such as a supply voltage applying time Ters_vdd_NC and an erase voltage applying time Ters_NC.

As shown in FIG. 12, an adjacent cell erase operation may be performed by applying time parameters such as a supply voltage applying time Ters_vdd_AC and an erase voltage applying time Ters_AC.

According to an exemplary embodiment of the present inventive concept, at least one of the applying time parameters (e.g., the supply voltage applying time Ters_vdd_NC and the erase voltage applying time Ters_NC) of the adjacent cell erase operation may be different from that of the normal cell erase operation.

A memory cell connected to a single word line most adjacent to a back-gate transistor BTG is defined as an adjacent cell shown in FIG. 4. However, the inventive concept is not limited to the above definition.

Figure 13:
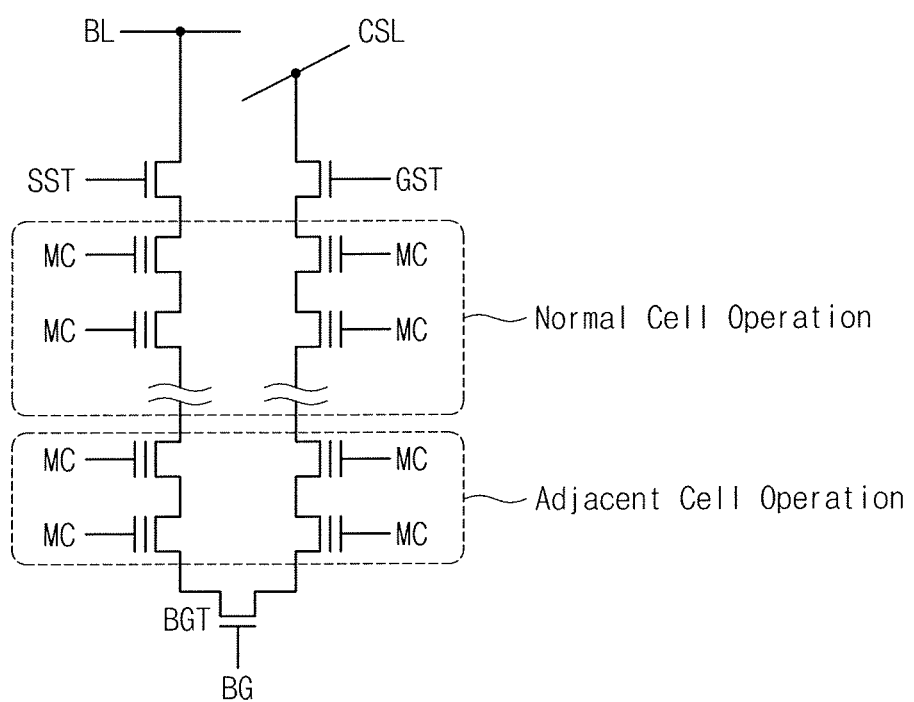
FIG. 13 illustrates an adjacent cell operation of a 3D memory device according to an exemplary embodiment of the present inventive concept.

FIG. 13 illustrates an adjacent cell operation of a 3D memory device according to an exemplary embodiment of the present inventive concept. Referring to FIG. 13, an adjacent cell is defined as a memory cell connected to a word line most adjacent to a back-gate transistor BGT and a memory cell connected to the next word line, as compared to the adjacent cell shown in FIG. 4.

In FIGS. 4 and 13, an adjacent cell is defined on the basis of a back-gate transistor BGT. However, the present inventive concept is not limited to the above definition. An adjacent cell according to an exemplary embodiment of the present inventive concept may be defined on the basis of select transistors SST and GST.

Figure 14:
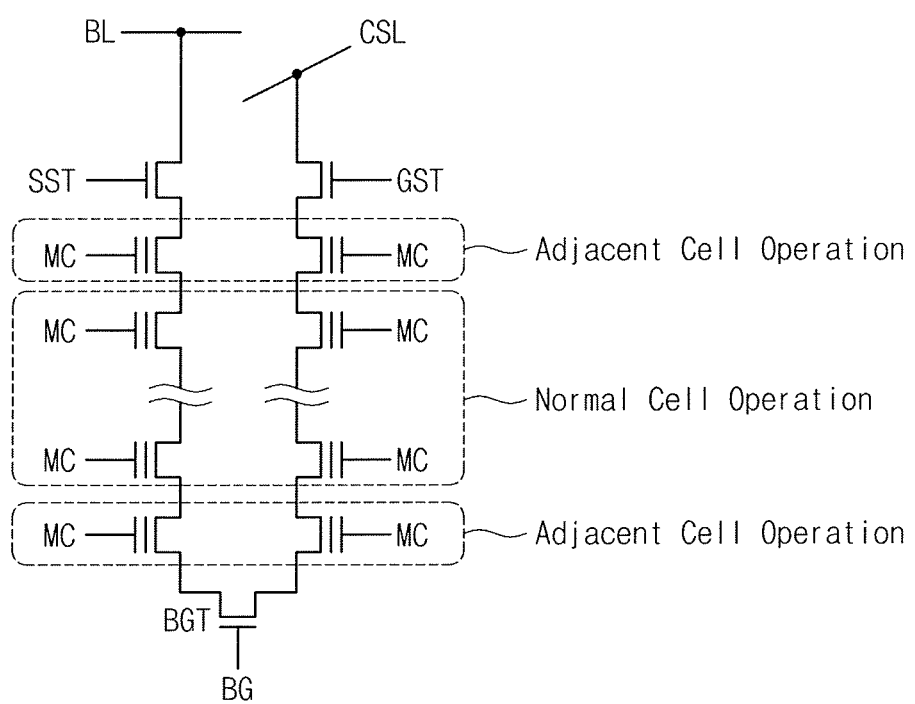
FIG. 14 illustrates an adjacent cell operation of a 3D memory device according to an exemplary embodiment of the present inventive concept.

FIG. 14 illustrates an adjacent cell operation of a 3D memory device according to an exemplary embodiment of the present inventive concept. Referring to FIG. 14, an adjacent cell is defined as a memory cell connected to a word line most adjacent to a string select transistor SST, a memory cell connected to a word line most adjacent to a ground select transistor GST, and a memory cell connected to a word line most adjacent to a back-gate transistor BGT.

In FIGS. 1 to 14, an adjacent cell operation different from a normal cell operation is described. The present inventive concept may be applied to dummy cells adjacent to a back-gate transistor BGT or select transistors SST and GST. For example, 3D memory device according to an exemplary embodiment of the present inventive concept may perform a dummy cell operation different from a normal cell operation.

Figure 15:
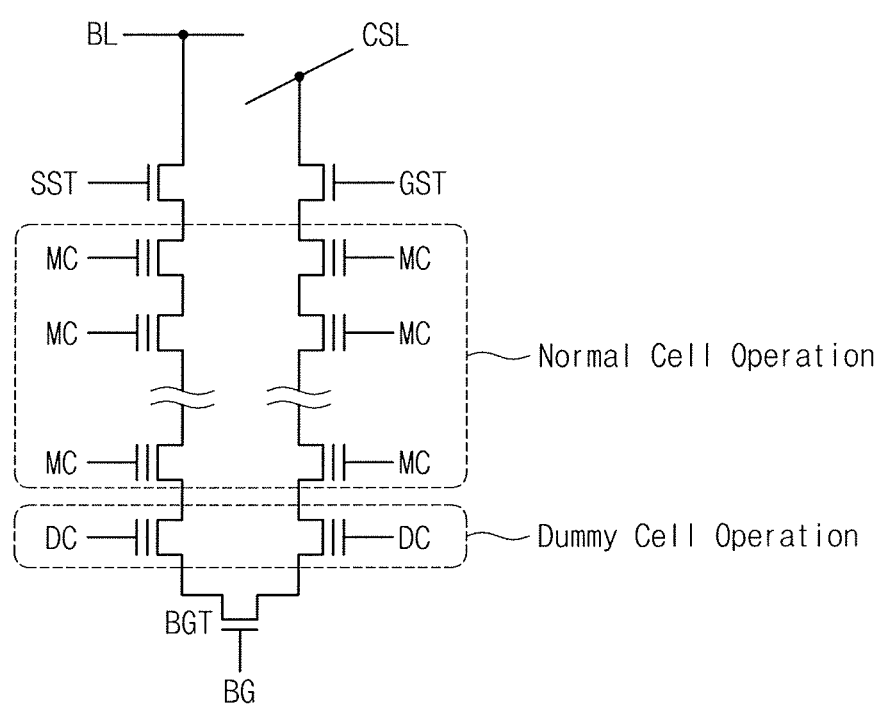
FIG. 15 illustrates a dummy cell operation of a 3D memory device according to an exemplary embodiment of the present inventive concept.

FIG. 15 illustrates a dummy cell operation of a 3D memory device according to an exemplary embodiment of the present inventive concept. Referring to FIG. 15, a string includes memory cells MCs to perform a normal cell operation and dummy cells DCs to perform a dummy cell operation. The dummy cell DC means memory cells connected to at least one dummy word line adjacent to a back-gate transistor BGT.

In FIG. 15, a dummy cell is defined as a memory cell connected to a dummy word line adjacent to a back-gate transistor BGT. However, the present inventive concept is not limited to the above definition. A dummy cell may also be a memory cell connected to a dummy word line adjacent to a select transistor SST or GST.

Figure 16:
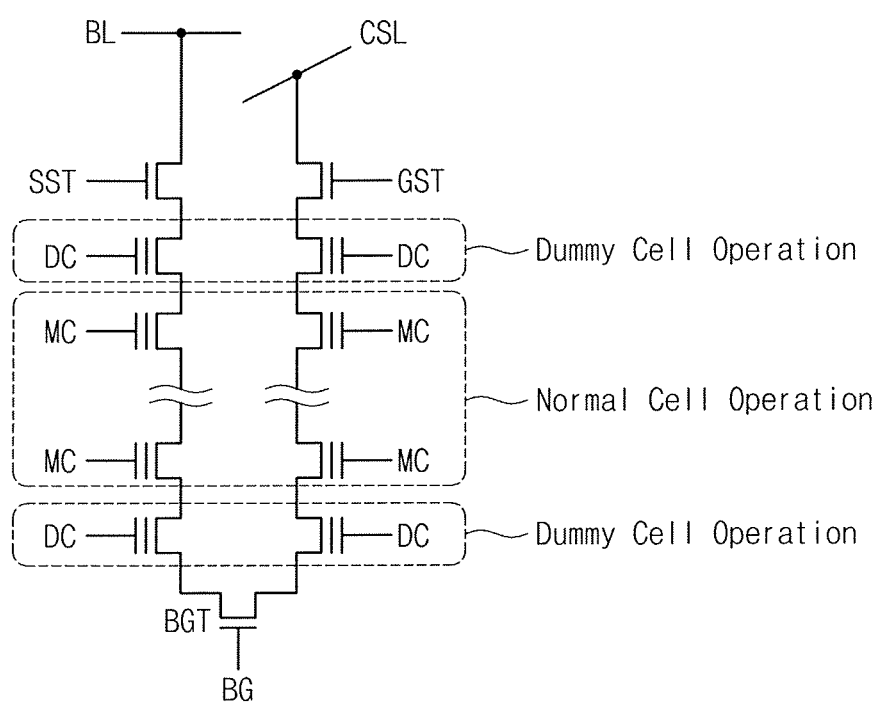
FIG. 16 illustrates a dummy cell operation of a 3D memory device according to an exemplary embodiment of the present inventive concept.

FIG. 16 illustrates a dummy cell operation of a 3D memory device according to an exemplary embodiment of the present inventive concept. Referring to FIG. 16, a dummy cell includes memory cells connected to a dummy word lines adjacent to a back-gate transistor BGT and memory cells connected to a dummy word line adjacent to select transistors SST and GST.

Figure 17:
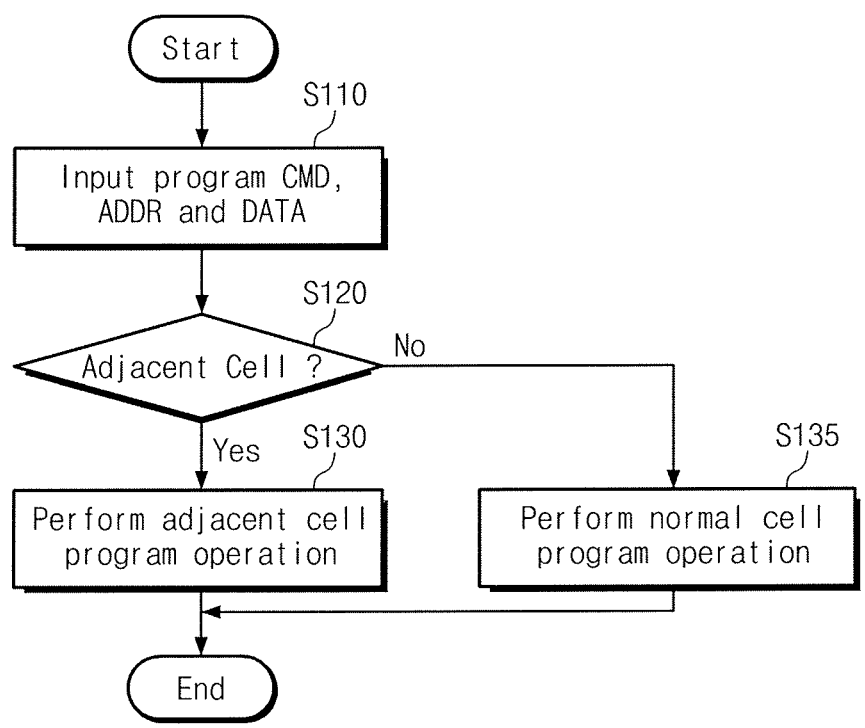
FIG. 17 is a flowchart summarizing a programming method of a 3D memory device according to an exemplary embodiment of the present inventive concept.

FIG. 17 is a flowchart summarizing a programming method of a 3D memory device according to an exemplary embodiment of the present inventive concept. A programming method will now be described below with reference to FIGS. 1 to 17.

The 3D memory device 100 receives a program command, an address, and data (S110). Based on the received address, determination is made on whether memory cells to be programmed are adjacent cells (S120). When the cell to be programmed is an adjacent cell, an adjacent cell program operation is performed as explained in FIGS. 5 to 7 (S130). When the cell to be programmed is not an adjacent cell, a normal cell program operation is performed as explained in FIGS. 5 to 7 (S135). Thus, the program operation is completed The programming method of the 3D memory device 100 according to an exemplary embodiment of the present inventive concept may determine whether or not to perform an adjacent cell program operation based on an input address.

Figure 18:
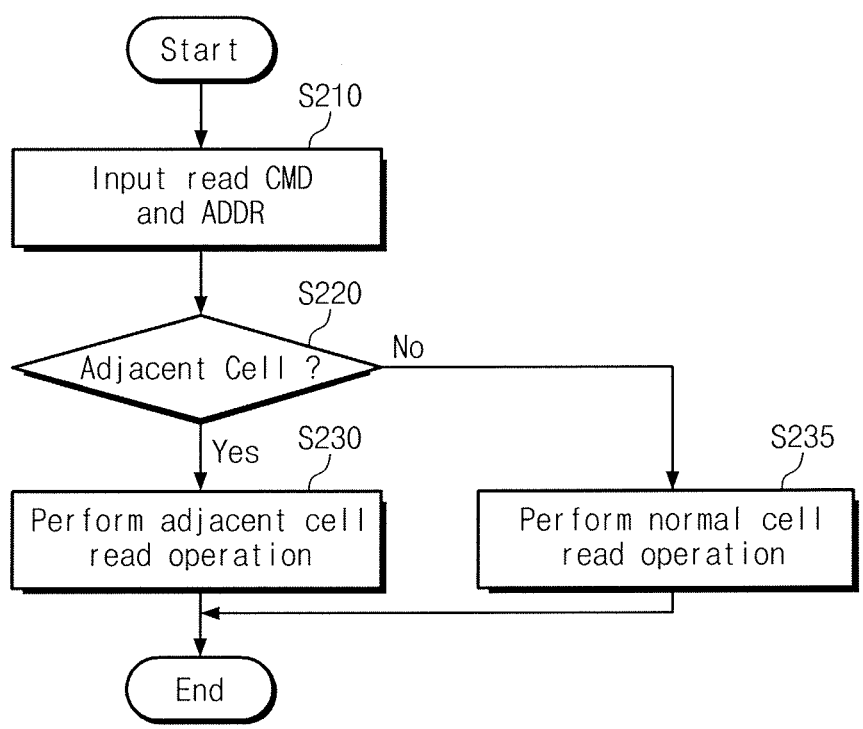
FIG. 18 is a flowchart summarizing a reading method of a 3D memory device according to an exemplary embodiment of the present inventive concept.

FIG. 18 is a flowchart summarizing a reading method of a 3D memory device according to an exemplary embodiment of the present inventive concept. The reading method will now be described below with reference to FIGS. 1 to 18.

The 3D memory device 100 receives a read command and an address (S210). Based on the received address, determination is made on whether memory cells to be read are adjacent cells (S220). When the memory cell to be read is an adjacent cell, an adjacent cell read operation is performed as explained in FIGS. 8 and 9 (S230). When the memory cell to be read is not an adjacent cell, a normal cell read operation is performed as explained in FIGS. 8 and 9 (S235). Thus, read operation is completed.

The reading method of the 3D memory device 100 according to an exemplary embodiment of the present inventive concept may determine whether or not to perform an adjacent cell read operation based on an input address.

Figure 19:
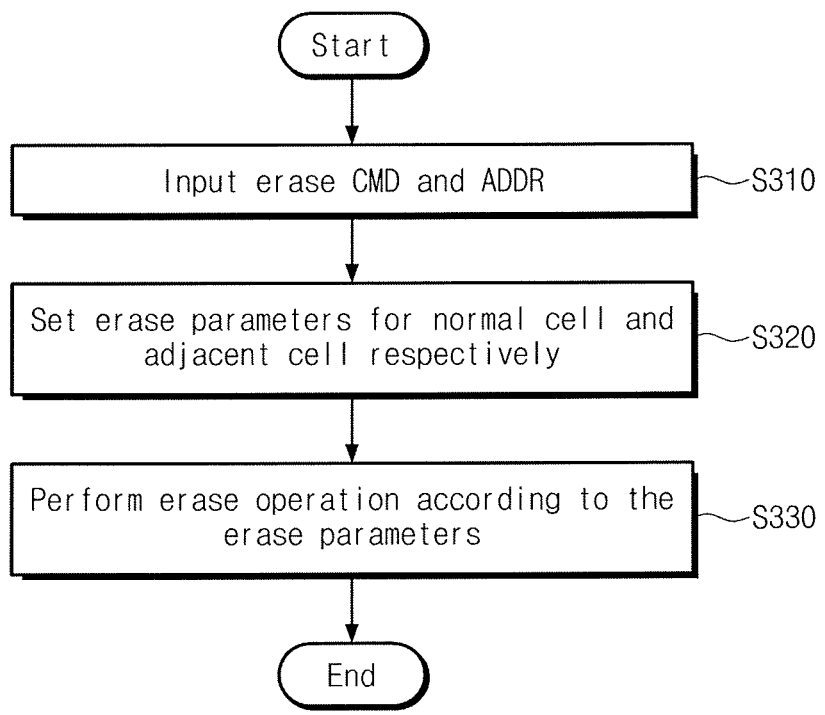
FIG. 19 is a flowchart summarizing an erasing method of a 3D memory device according to an exemplary embodiment of the present inventive concept.

FIG. 19 is a flowchart summarizing an erasing method of a 3D memory device according to an exemplary embodiment of the present inventive concept. The erasing method will now be described below with reference to FIGS. 1 to 16 and FIG. 19.

The 3D memory device 100 receives an erase command and an address (S310). As explained in FIGS. 10 to 12, at least one of erase parameters, at least one of erase offset parameters, and at least one of applying time parameters are set to be different in a normal cell and an adjacent cell (S320). In addition, an erase operation is performed based on the set erase parameters, the erase offset parameters, and the set applying time parameters (S330).

The erasing method of the 3D memory device 100 according to an exemplary embodiment of the present inventive concept may perform an erase operation by at least one erase parameter, in case of an adjacent cell, which is set to be different from that of a normal cell.

Figure 20:
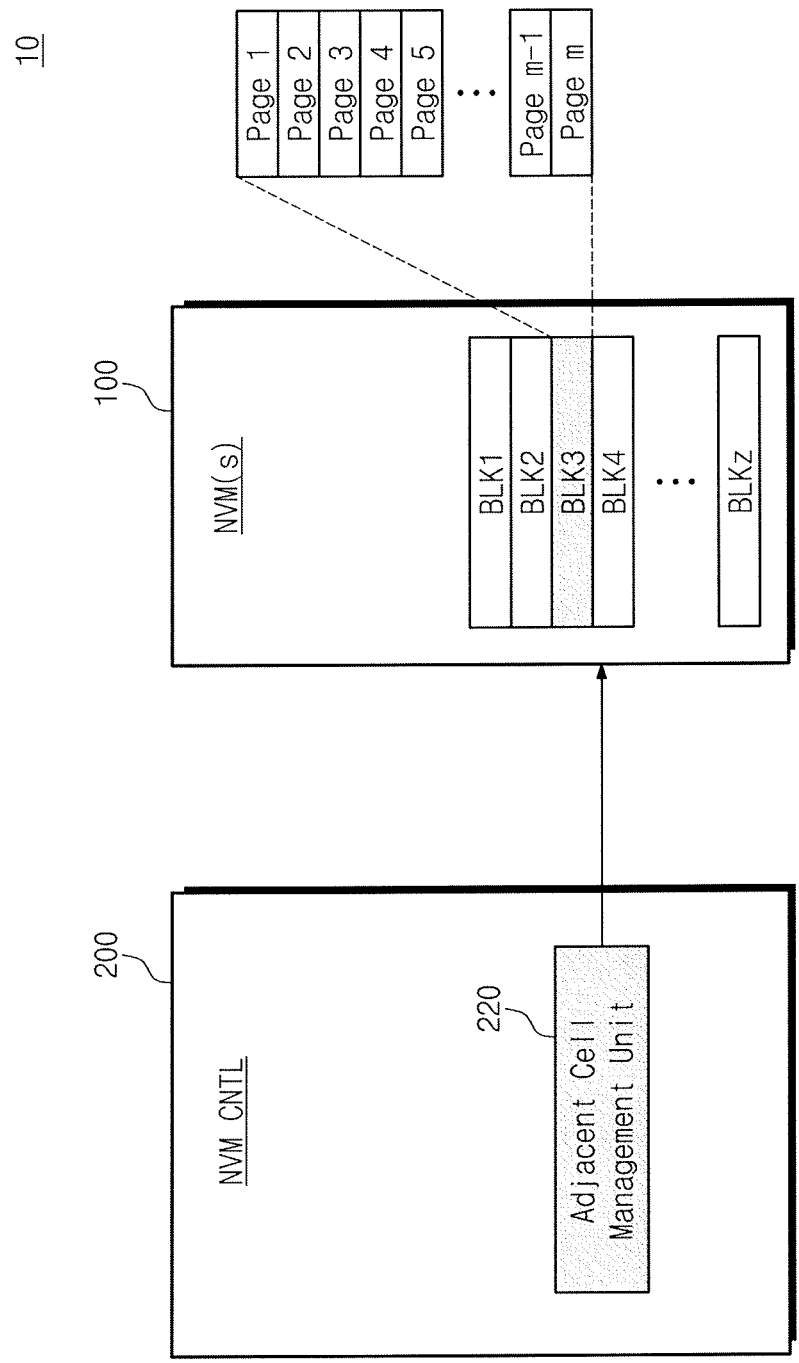
FIG. 20 illustrates a storage device according to an exemplary embodiment of the present inventive concept.

FIG. 20 illustrates a storage device 10 according to an exemplary embodiment of the present inventive concept. As illustrated, the storage device 10 includes at least one nonvolatile memory device 100a and a memory controller 200 to control the at least one nonvolatile memory device 100a.

The at least one nonvolatile memory device 100 may be implemented using the 3D memory device 100 shown in FIG. 1, or the at least one nonvolatile memory device 100 may be implemented to perform an adjacent cell operation different from a normal cell operation or a dummy cell operation, as explained in FIGS. 1 to 19.

The memory controller 200 may include an adjacent cell management unit 220 to politically manage an adjacent cell (or dummy cell). For example, when an adaptive programming method policy or a read defense code policy is used, the adjacent cell management unit 220 may be enabled.

In an exemplary embodiment, the adjacent cell management unit 220 may be enabled according to a degradation index of a memory cell to operate. For example, when a degradation index of a memory cell to operate exceeds a predetermined value, the adjacent cell management unit 220 may perform an adjacent cell program operation on adjacent memory cells.

In an exemplary embodiment, the adjacent cell management unit 220 may be enabled when a read operation fails. For example, when an error of data read during a read operation is not corrected, the adjacent cell management unit 220 may perform an adjacent read retry on adjacent memory cells.

In an exemplary embodiment, the adjacent cell management unit 220 may be enabled in response to a request of a host.

In an exemplary embodiment, the memory controller 220 may manage memory cells adjacent to a back-gate with a dummy cell.

The storage device 10 may perform an adjacent cell operation according to a predetermined core operation condition or a predetermined core policy.

Figure 21:
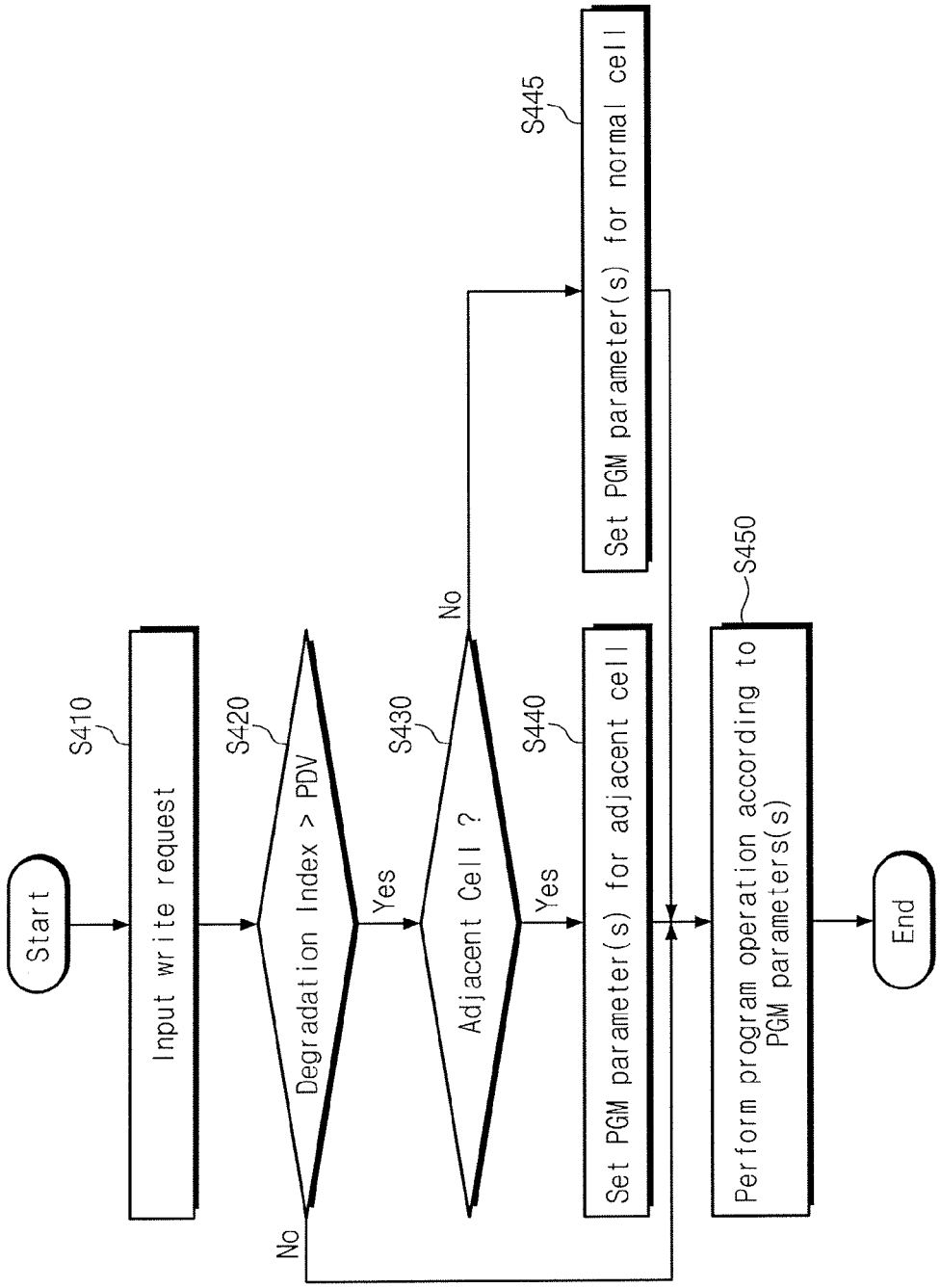
FIG. 21 is a flowchart summarizing a writing method of a storage device according to an exemplary embodiment of the present inventive concept.

FIG. 21 is a flowchart summarizing a writing method of a storage device 10 according to an exemplary embodiment of the present inventive concept. The writing method of the storage device 10 will now be described below with reference to FIGS. 20 and 21.

A write request is externally input. In this case, write data and an address may also be input. The memory controller 200 of the storage device converts the input write data and the input address into data and an address to be programmed into the nonvolatile memory device 100a (S410). The adjacent cell management unit 220 of the memory controller 200 determines whether a degradation index of a memory block to be selected is greater than a predetermined value PDV, based on the converted address. The degradation index may be an index created based on at least one environmental information related with the degradation of a memory cell such as an erase count, a program count, a read count, the degree of temperature, and program time information (S420).

When the degradation index is greater than the predetermine value PDV, it is determined whether the memory cell to be programmed is an adjacent cell (S430). When the memory cell to be programmed is an adjacent cell, at least one program parameter for the adjacent cell is set (S440). When the memory cell to be programmed is not an adjacent cell, at least one parameter for a normal cell is set (S445).

In addition, a program operation is performed when the degradation is not greater than the predetermined value PDV or according to the program parameter set after the S440 or S445 (S450).

According to the above-described writing method, a program operation may be performed according to the policy of a program parameter for an adjacent cell.

Figure 22:
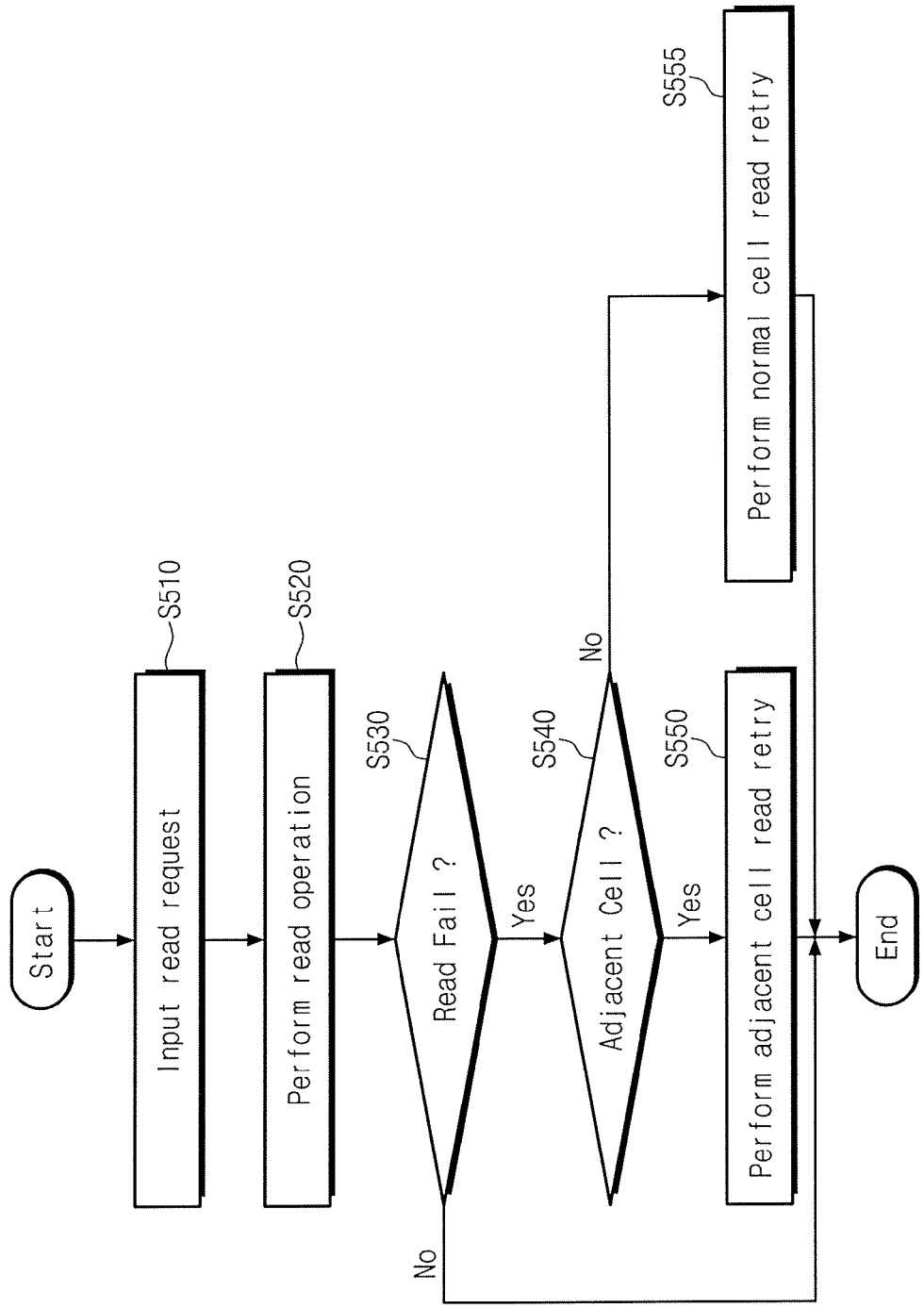
FIG. 22 is a flowchart summarizing a reading method of a storage device according to an exemplary embodiment of the present inventive concept.

FIG. 22 is a flowchart summarizing a reading method of a storage device 10 according to an exemplary embodiment of the present inventive concept. The reading method of the storage device 10 will now be described below with reference to FIGS. 20 and 22.

A read request is externally input. In this case, an address corresponding to data to be read may also be input (S510). The memory controller 200 reads data from a physical space of the nonvolatile memory device 100 corresponding to the input address (S520).

When there is an error in the read data, an error operation may be performed. If the error cannot be corrected although the error operation is performed, this operation may be treated as read failure (S530). When the read operation fails, it is determined on whether a memory cell to be read is an adjacent cell (S540). When the memory cell to be read is an adjacent cell, an adjacent cell read retry may be performed (S550). The read retry means that a read operation is performed by changing at least one read condition. When the memory cell to be read is not an adjacent cell, a normal cell read retry may be performed (S555).

In addition, the error is corrected through an error correction operation or a read operation is completed after the S550 or S555.

According to the above-described the reading method, a read operation may be performed according to a read retry policy for an adjacent cell.

Figure 23:
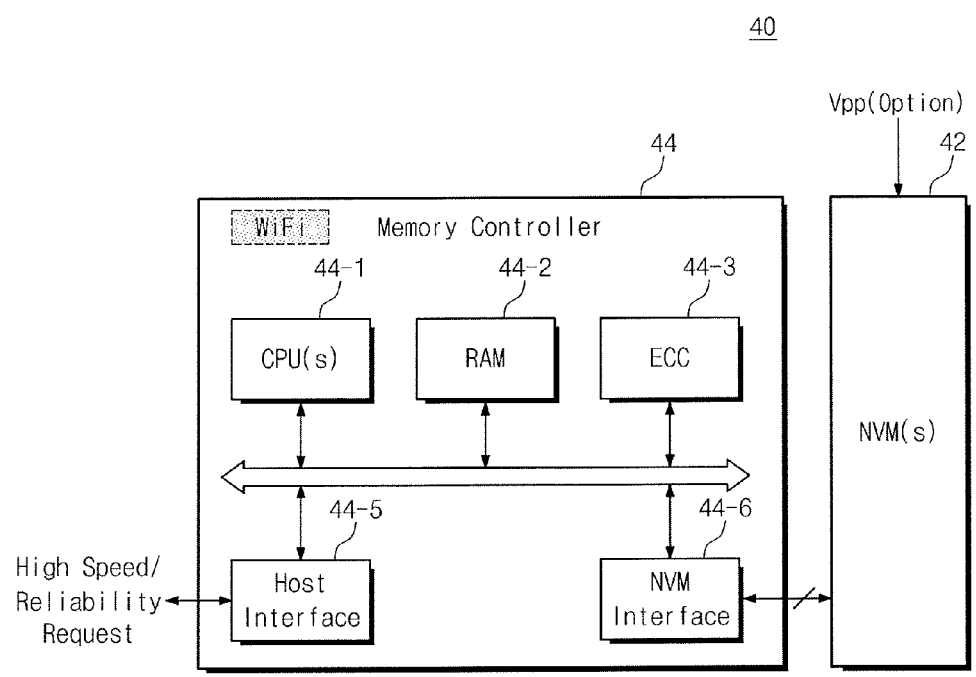
FIG. 23 illustrates a memory system according to an exemplary embodiment of the present inventive concept.

FIG. 23 illustrates a memory system 40 according to an exemplary embodiment of the present inventive concept. As illustrated, the memory system 40 includes at least one nonvolatile memory device 42 and a memory controller 44 to control the at least one nonvolatile memory device 42. The memory system 40 may be a storage medium such as a memory card (e.g., a CompactFlash (CF) memory card, a Secure Digital (SD) card, a microSD card, etc.) and a Universal Serial Bus (USB) storage device.

The nonvolatile memory device 42 may be implemented using the 3D memory device 100 shown in FIG. 1 or the nonvolatile memory device 100 shown in FIG. 20. The memory controller 44 may be implemented using the memory controller 200 shown in FIG. 20. The memory controller 44 may perform an adjacent cell operation according to a special request of a host.

The memory controller 44 controls read, write, and erase operations for the nonvolatile memory device 42 according to a request of the host. The memory controller 44 includes at least one central processing unit (CPU) 44-1, a buffer memory 44-2, an error correction code (ECC) circuit 44-3, a host interface 44-5, and a nonvolatile memory interface (NVM Interface) 44-6.

The CPU 44-1 may control the overall operation (e.g., read, write, file system management, bad page management, etc.) of the nonvolatile memory device 12. The RAM 44-2 operates according to control of the CPU 44-1 and may be used as a work memory, a buffer memory, and a cache memory. When the RAM 44-2 is used as a work memory, data processed by the CPU 44-1 is temporarily stored. When the RAM 44-2 is used as a buffer memory, it buffers data to be transferred from a host to the nonvolatile memory device and/or transferred from the nonvolatile memory device 12 to the host. When the RAM 44-2 is used as a cache memory, it enables a low-speed nonvolatile memory device 12 to operate at high speed.

The ECC circuit 44-3 generates an error correction code (ECC) to correct a fail bit or an error bit of data received from the nonvolatile memory device 42. The ECC circuit 44-3 performs error correction encoding on data provided to the nonvolatile memory device 42 to generate data to which a parity bit is added. The parity bit may be stored in the nonvolatile memory device 42. The ECC circuit 44-3 may perform error correction decoding on data output from the nonvolatile memory device 42. The ECC circuit 44-3 may correct an error using a parity bit. The ECC circuit 44-3 may correct an error using coded modulation such as low density parity check (LDPC) code, BCH code, turbo code, Reed-Solomon code, convolution code, recursive systematic code (RSC), trellis-coded modulation (TCM), block coded modulation (BCM).

The memory controller 44 exchanges data with a host via the host interface 44-5, and the memory controller 44 exchanges data with the nonvolatile memory device 12 via the NVM interface 44-6. The host interface 44-5 may be connected to the host via a parallel AT attachment bus (PATA), a serial AT attachment bus (SATA), a Small Computer System Interface (SCSI), a USB, a Peripheral Component Interconnect express (PCIe), an SD, a serial attached SCSI (SAS), a Universal Flash Storage (UFS), and a NAND interface.

In an exemplary embodiment, the memory controller 44 may have a wireless communication function (e.g., an WiFi).

The above-described memory system 40 may perform an adjacent cell operation to demonstrate an optimal function.

Figure 24:
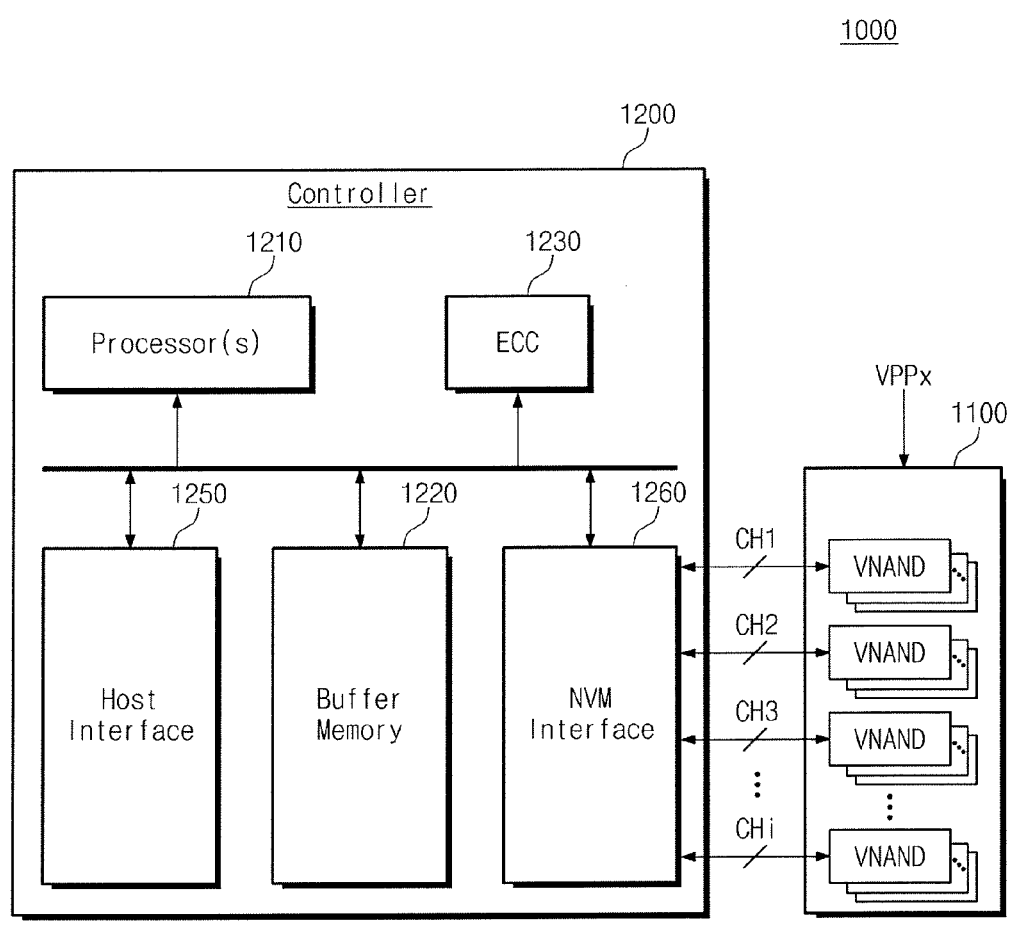
FIG. 24 illustrates an SSD according to an exemplary embodiment of the present inventive concept.

The present inventive concept may be applied to a solid state drive (SSD). FIG. 24 illustrates an SSD 1000 according to an exemplary embodiment of the present inventive concept. As illustrated, the SSD 1000 includes a plurality of nonvolatile memory devices 1100 and an SSD controller 1200.

The nonvolatile memory devices 1100 may be implemented to optionally receive an external high voltage Vpp. Each of the nonvolatile memory devices 1100 may be implemented using the 3D memory device 100 of FIG. 1 or the nonvolatile memory device 100 of FIG. 20.

The SSD controller 1200 is connected to the nonvolatile memory devices 1100 via a plurality of channels CH1 to CHi (i being an integer equal to or greater than 2). The SSD controller 1200 includes at least one processor 1210, a buffer memory 1220, an error correction code (ECC) circuit 1230, a host interface 1250, and a nonvolatile memory interface 1260.

The buffer memory 1220 may temporarily store data required to drive the memory controller 1200. The buffer memory 1220 may include a plurality of memory lines to store data or a command. The memory lines may be mapped to cache lines by various methods. The ECC circuit 1230 may calculate an ECC value of data to be programmed during a write operation, correct an error of data read during a read operation based on the ECC value, and correct an error of restored data from the nonvolatile memory device 1100 during a data restore operation. Although not shown, the SSD controller 1200 may further include a code memory storing code data required to drive the memory controller 1200. The code memory may be implemented using a nonvolatile memory device.

The host interface 1250 may provide an interface function with an external device. The host interface 1250 may be a NAND flash interface. The host interface 1250 may be implemented using various interfaces, other than the NAND flash interface. The nonvolatile memory interface 1260 may provide an interface function with the nonvolatile memory device 1100.

The SSD 1000 may operate under an optimal operation condition depending on cell characteristics to enhance performance.

Figure 25:
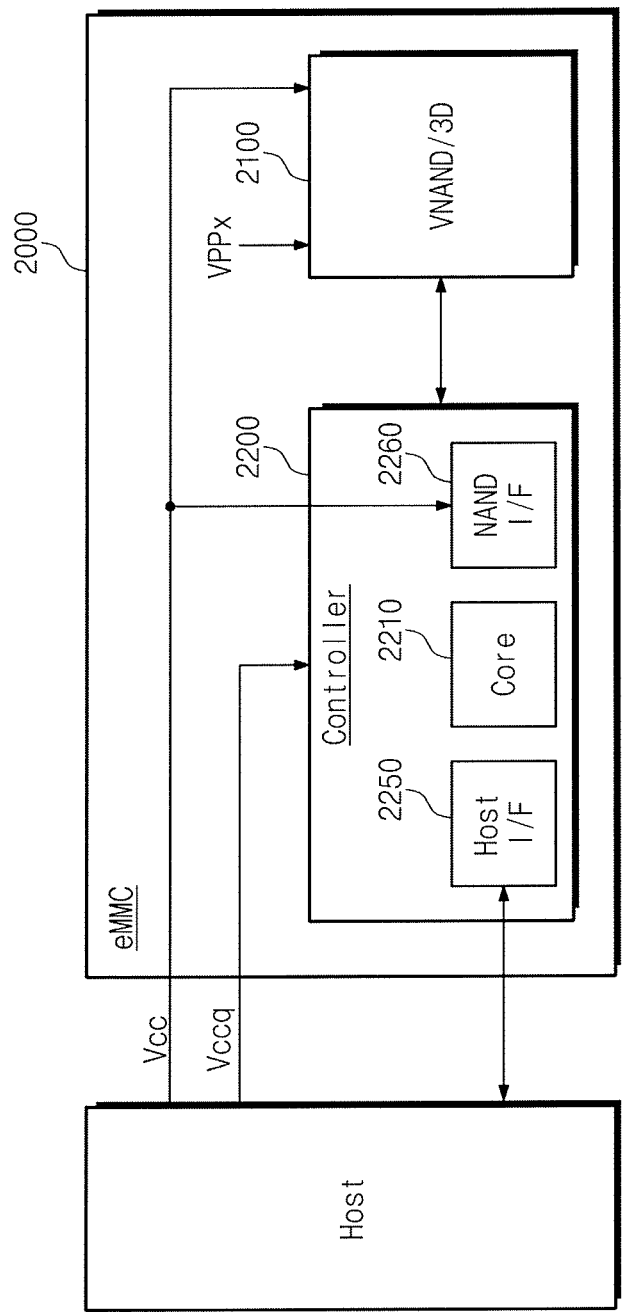
FIG. 25 illustrates an eMMC according to an exemplary embodiment of the present inventive concept.

The present inventive concept may be applied to an embedded multimedia card (eMMC), a moviNAND flash memory, and an iNAND flash memory. FIG. 25 illustrates an eMMC 2000 according to an exemplary embodiment of the present inventive concept. As illustrated, the eMMC 2000 may include at least one NAND flash memory device 2100 and a memory controller 2200.

The NAND flash memory device 2100 may be implemented using the nonvolatile memory device described with reference to FIG. 1 or the nonvolatile memory device 100 shown in FIG. 20. The memory controller 2200 is connected to the NAND flash memory device 2100 through a plurality of channels. The memory controller 2200 may be implemented using the memory controller 200 shown in FIG. 20.

The memory controller 2200 includes at least one control core 2210, a host interface 2250, and a NAND interface 2260. The at least one control core 2210 controls the overall operation of the eMMC 2000. The host interface 2250 performs host interfacing with the controller 2210. The NAND interface 2260 performs interfacing between the NAND flash memory device 2100 and the controller 2200. In an exemplary embodiment, the host interface 2250 may be a parallel interface (e.g., an MMC interface). In an exemplary embodiment, the host interface 2250 of the eMMC 2000 may be a serial interface (e.g., a UHS-II or UFS interface). In an exemplary embodiment, the host interface 2250 may be a NAND interface.

The eMMC 2000 receives supply voltages Vcc and Vccq from a host. A first supply voltage Vcc (e.g., 3.3 volt) is supplied to the NAND flash memory device 2100 and the NAND interface 2230, and a second supply voltage Vccq (e.g., 1.8 volt or 3.3 volt) is supplied to the controller 2200. In an exemplary embodiment, the eMMC 2000 may optionally receive an external high voltage Vpp.

The above-described eMMC 2000 may perform an optimal operation depending on cell characteristics to reduce an error occurrence rate and achieve a high-speed operation.

Figure 26:
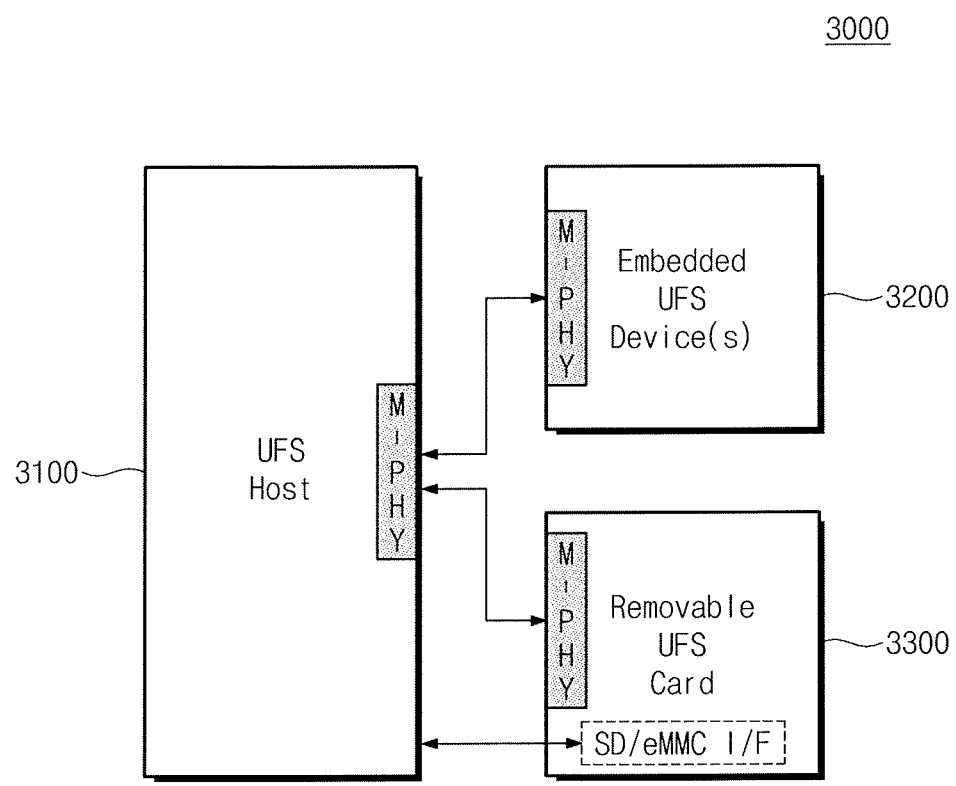
FIG. 26 illustrates a UFS system according to an exemplary embodiment of the present inventive concept.

The present inventive concept may be applied to a universal flash storage (UFS). FIG. 26 is a block diagram of a UFS system 3000 according to an exemplary of the present inventive concept. As illustrated, the UFS system 3000 may include a UFS host 3100, at least one embedded UFS device 3200, and a removable UFS card 3300. Communication between the UFS host 3100 and the embedded UFS device 3200 and communication between the UFS host 3100 and the removable UFS card 3300 may be performed through an M-PHY layer.

At least one of the embedded UFS device 3200 and the removable UFS card 3300 may be implemented using the storage device 10 shown in FIG. 20 or the memory system 40 shown in FIG. 21.

The host 3100 may include a bridge to communicate with the removable UFS card 3400 using a different protocol from the UFS protocol. The UFS host 3100 and the removable UFS card 3400 may communicate with each other using various card protocols (e.g., a USB Flash Device (UFD), an MMC, s secure digital (SD), a mini SD, a micro SD, etc.).

Figure 27:
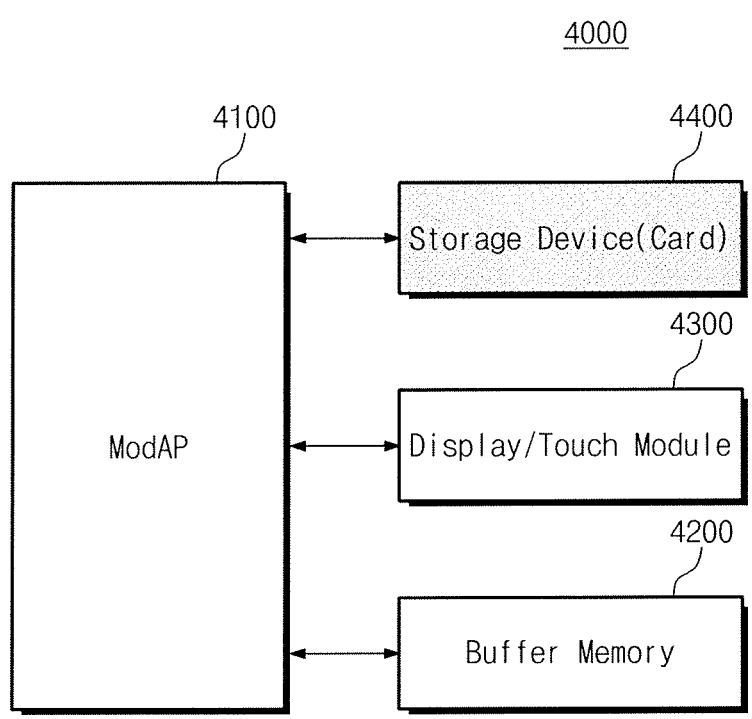
FIG. 27 illustrates a mobile device according to an exemplary embodiment of the present inventive concept.

The present inventive concept may be applied to a mobile device. FIG. 27 is a block diagram of a mobile device 4000 according to an exemplary of the present inventive concept. As illustrated, the mobile device 4000 may include an integrated processor (ModAP) 4100, a buffer memory 4200, a display/touch module 4300, and a storage device 4400.

The integrated processor 4100 controls the overall operation of the mobile device 4000 and wired/wireless communication with an external entity. The buffer memory 4200 may be implemented to temporarily store data required during a processing operation of the mobile device 4000. The display/touch module 4300 may be implemented to display data processed by the application processor 4100 or receive data from a touch panel. The storage device 4400 may be implemented to store user data. The storage device 4400 may be an eMMC, an SSD or a UFS device. The storage device 4400 may perform an adjacent cell operation/a dummy cell operation, as described in FIGS. 1 to 20.

The above-described mobile device 4000 may perform an adjacent cell operation/a dummy cell operation to have optimal operation performance.

The mobile device 4000 may perform an optimal read operation using a timetable to enhance systemic performance.

A memory system or a storage device according to an exemplary embodiment of the present inventive concept may be packaged as one of various types to be subsequently embedded. For example, the memory system or the storage device may be packaged by at least one of Package on Package (POP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-Level Processed Stack Package (WSP).

While the present inventive concept has been described with reference to exemplary embodiments thereof, the present inventive concept should not be construed as limited to the above-described embodiments. It will be understood by those of ordinary skill in the art that various changes and modifications in form and details may be made therein without departing from the spirit and scope of the present inventive concept as defined by the following claims.

What is claimed is:

1. A three-dimensional (3D) memory device comprising:
   memory blocks each including a plurality of strings, wherein each of the plurality of strings includes at least one string select transistor, first memory cells, a back-gate transistor, second memory cells, and at least one ground select transistor coupled in series between a bit line and a common source line, wherein each of the first and second memory cells includes a pillar-shaped semiconductor layer stacked in a direction perpendicular to a substrate, an insulating layer surrounding the semiconductor layer, a charge storage layer surrounding the insulating layer, and an insulating layer surrounding the charge storage layer;
   an address decoder configured to select one of the memory blocks in response to an address by driving a string select line connected to the string select transistor, word lines connected to the first and second memory cells, a back-gate line connected to the back-gate transistor, and a ground select line connected to the ground select transistor;
   a voltage generation circuit configured to generate voltages applied to the bit line, the common source line, the string select line, the word lines, the back-gate line, and the ground select line;
   an input/output circuit configured to provide data into the selected memory block or to read data from the selected memory block; and
   a control logic configured to control the address decoder, the voltage generation circuit, and the input/output circuit such that an adjacent cell operation on at least one memory cell adjacent to the back-gate transistor among the first and second memory cells of the selected memory block is made different from a normal cell operation on the other memory cells.

2. The 3D memory device as set forth in claim 1, wherein the adjacent cell operation is performed by at least one program parameter among a program start voltage, an offset of incremental stepping program pulse (ISPP), a pass voltage, a read pass voltage, a verify voltage, a program voltage applying time, a pass voltage applying time, and a verify voltage applying time,
   wherein the at least one program parameter is different from that of the normal cell operation.

3. The 3D memory device as set forth in claim 1, wherein the adjacent cell operation is performed by at least one read parameter among at least one read voltage, at least one read time, and a read pass voltage,
   wherein the at least one read parameter is different from that of the normal cell operation.

4. The 3D memory device as set forth in claim 1, wherein the adjacent cell operation is performed by at least one sensing parameter among a precharge voltage, a develop voltage, a precharge time, and a sense time,
   wherein the at least one sensing parameter is different from that of the normal cell operation.

5. The 3D memory device as set forth in claim 1, wherein the adjacent cell operation is performed by at least one erase parameters among an erase start voltage, an offset of incremental stepping erase pulse (ISPE), a word line erase voltage, an erase verify voltage, an erase voltage applying time, and an erase verify voltage applying time,
   wherein the at least one erase parameter is different from those of the normal cell operation.

6. The 3D memory device as set forth in claim 1, wherein the adjacent cell operation is performed on at least one memory cell adjacent to at least one of the string select transistor and the ground select transistor among the first and second memory cells.

7. A storage device comprising:
   at least one nonvolatile memory device including memory blocks having a pipe-shaped bit cost scalable (PBiCS) structure, wherein each of the memory blocks penetrates word lines stacked on a substrate in the form of plates and includes a first pillar, a second pillar including a semiconductor layer, an insulating layer, and a charge storage layer, and a back-gate including a pillar connection portion to connect the first and second pillars to each other and being disposed between the substrate and the word lines; and
   a memory controller including an adjacent cell management unit, wherein the adjacent cell management unit is configured to control the at least one nonvolatile memory device such that a program operation, an erase operation or a read operation is performed on at least one memory cell adjacent to the back-gate, unlike the other memory cells.

8. The storage device as set forth in claim 7, wherein the adjacent cell management unit is enabled according to a degradation index of a memory cell to operate.

9. The storage device as set forth in claim 8, wherein the adjacent cell management unit performs an adjacent cell program operation on the at least one memory cell adjacent to the back-gate when the degradation index of the memory to operate exceeds a predetermined value.

10. The storage device as set forth in claim 7, wherein the adjacent cell management unit is enabled when a read operation fails.

11. The storage device as set forth in claim 10, wherein the adjacent cell management unit performs an adjacent read retry on the at least one memory cell adjacent to the back-gate when an error of read data during the read operation is not corrected.

12. The storage device as set forth in claim 7, wherein the adjacent cell management unit is enabled in response to a request of a host.

13. The storage device as set forth in claim 7, wherein the memory controller manages the at least one memory cell adjacent to the back-gate as a dummy cell.

14. An operating method of a storage device including a memory controller for controlling at least one nonvolatile memory device and the at least one nonvolatile memory device, wherein the at least one nonvolatile memory device includes memory blocks having a pipe-shaped bit cost scalable (PBiCS) structure, wherein each of the memory blocks penetrates word lines stacked on a substrate in the form of plates and includes a first pillar, a second pillar including a semiconductor layer, an insulating layer, and a charge storage layer, and a back-gate including a pillar connection portion connecting the first and second pillars to each other and being disposed between the substrate and the word lines, the operating method comprising:

determining whether a memory cell to operate is an adjacent cell adjacent to the back-gate, based on an address;

performing an adjacent cell operation when the memory cell to operate is the adjacent cell; and performing a normal cell operation when the memory cell to operate is not the adjacent cell, wherein the adjacent cell operation is performed by at least one core operation condition or at least one core operation policy which is different from that of the normal cell operation.

\* \* \* \* \*